United States Patent [19]
Koike et al.

[11] Patent Number: 5,523,576
[45] Date of Patent: Jun. 4, 1996

[54] CHARGED BEAM DRAWING APPARATUS

[75] Inventors: Tooru Koike, Tokyo; Ichiro Mori, Yokohama; Yuji Takigami, Isehara; Kazuyoshi Sugihara, Yokosuka; Atsushi Miyagaki, Tokyo; Hideo Kusakabe, Chiba, all of Japan

[73] Assignee: Kabushiki Kaisha Toshiba, Kawasaki, Japan

[21] Appl. No.: 213,041

[22] Filed: Mar. 15, 1994

[30] Foreign Application Priority Data

Mar. 15, 1993 [JP] Japan .................. 5-054369

[51] Int. Cl.⁶ .................................. G01N 23/225
[52] U.S. Cl. .................................. 250/491.1; 250/397
[58] Field of Search .................. 250/397, 491.1, 250/492.2

[56] References Cited

U.S. PATENT DOCUMENTS

| | | | |
|---|---|---|---|
| 4,327,292 | 4/1982 | Wang et al. | 250/491.1 |
| 4,390,788 | 6/1983 | Hayashi et al. | 250/491.1 |
| 4,503,334 | 3/1985 | King et al. | 250/491.1 |
| 4,791,302 | 12/1988 | Nozue | 250/491.1 |
| 5,043,586 | 8/1991 | Giuffre et al. | 250/491.1 |
| 5,049,745 | 9/1991 | Vogen et al. | 250/307 |
| 5,285,075 | 2/1994 | Mimamide et al. | 250/491.1 |
| 5,334,846 | 8/1994 | Nakano et al. | 250/491.1 |

FOREIGN PATENT DOCUMENTS 61-283121  12/1986  Japan .

OTHER PUBLICATIONS

Spie, vol. 1088, Optical/Laser Microlithography II, pp. 424–433, 1989, J. D. Buckley, et al., "Step and Scan: A Systems Overview of a New Lithography Tool".

*Primary Examiner*—Bruce C. Anderson
*Attorney, Agent, or Firm*—Oblon, Spivak, McClelland, Maier & Neustadt

[57] ABSTRACT

In a charged beam drawing apparatus for drawing a desired pattern on a sample by deflecting a charged beam on the sample while continuously moving a stage on which the sample is placed, a mark having a line-and-space pattern, in which a plurality of heavy metal marks each having a width equal to a side of the charged beam are arranged with spaces each equal to the width between them, is formed on the sample. The charged beam is radiated onto the mark while the position of the beam is fixed, and at the same time the stage is continuously moved in the longitudinal direction of the mark, thereby detecting a reflected beam from the mark. On the basis of the signal of the detected reflected beam, a relative vibration during the continuous movement of the stage is measured. This makes it possible to measure the relative vibration produced by the continuous movement of the stage, resulting in an increase in drawing accuracy.

33 Claims, 22 Drawing Sheets

FIG. 1A (PRIOR ART)
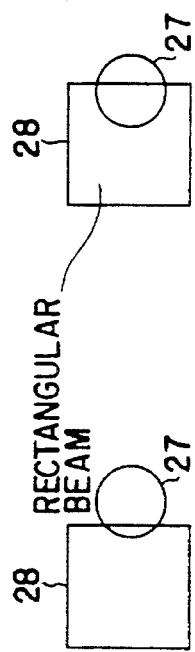
FIG. 1B (PRIOR ART)
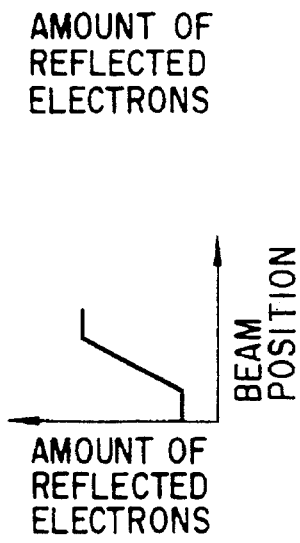
FIG. 1C (PRIOR ART)
FIG. 1D (PRIOR ART)
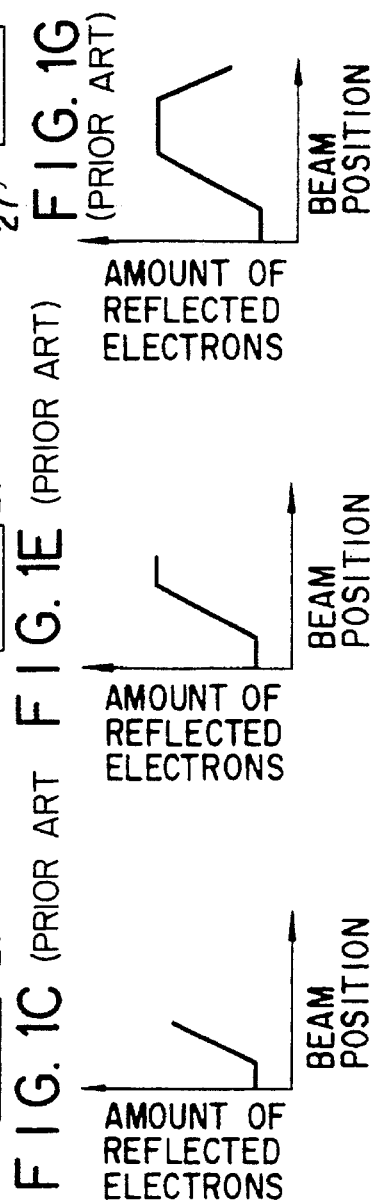
FIG. 1E (PRIOR ART)
FIG. 1F (PRIOR ART)
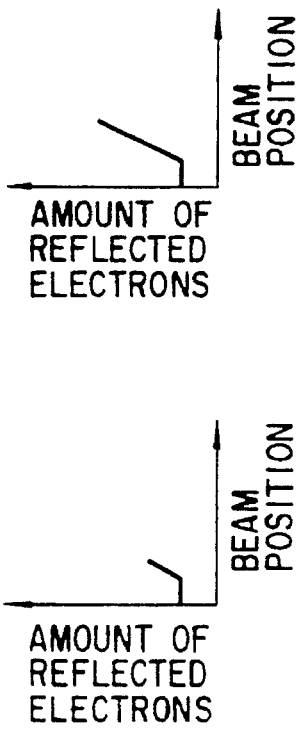
FIG. 1G (PRIOR ART)
FIG. 1H (PRIOR ART)
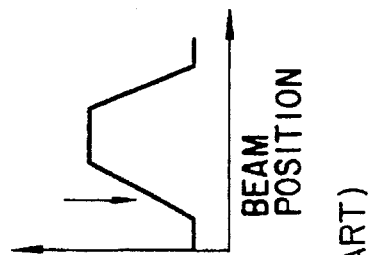
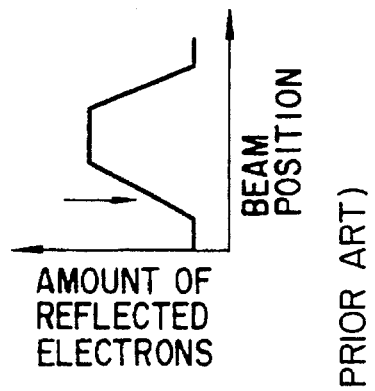
BEAM IS RADIATED AT CENTER OF GOLD PARTICLE IN MEASUREMENT
FIG. 1I (PRIOR ART)

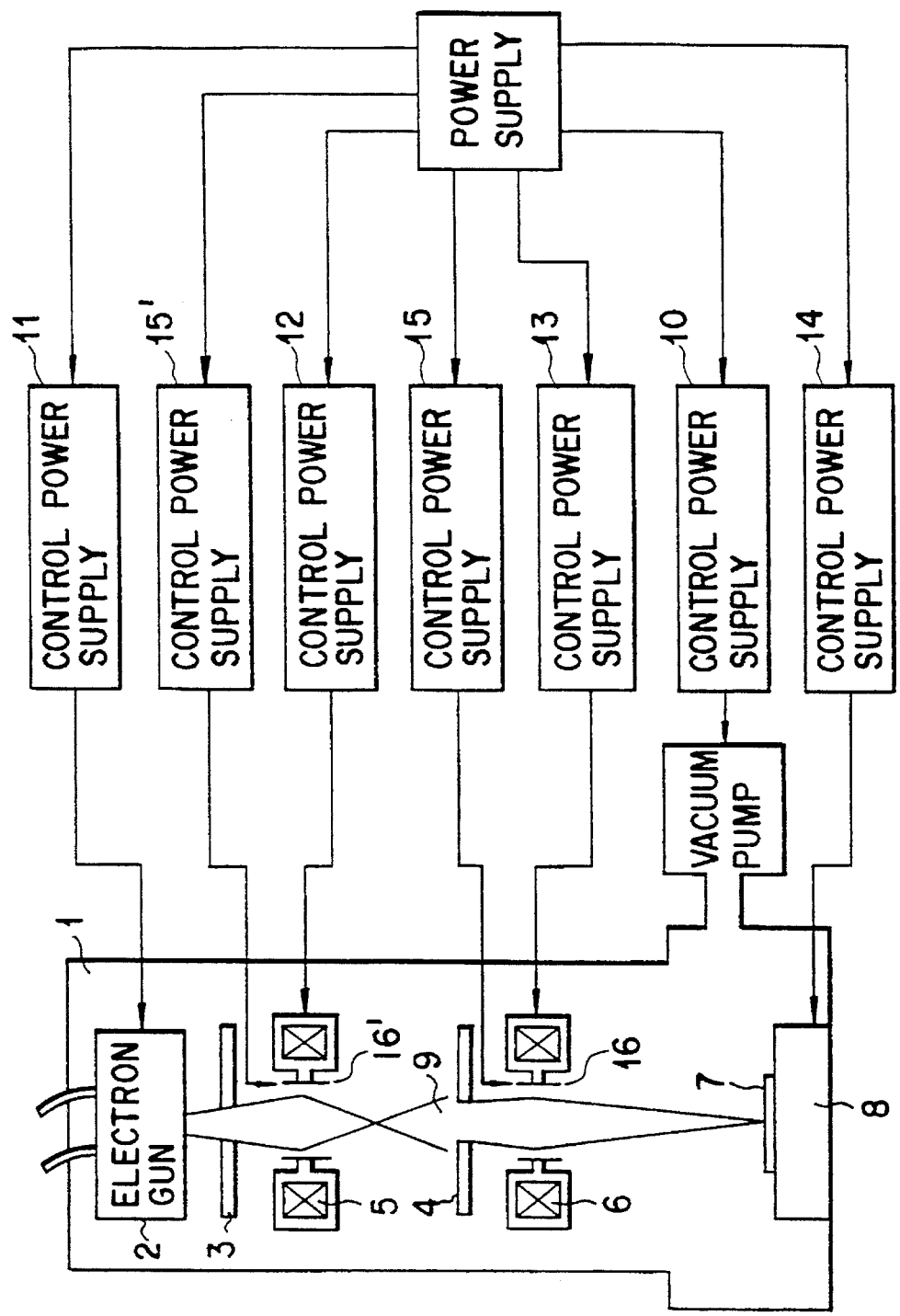

MEASUREMENT MARK IN CONTINUOUS MOVING DIRECTION OF STAGE

MEASUREMENT MARK IN DIRECTION PERPENDICULAR TO MOVING DIRECTION OF STAGE

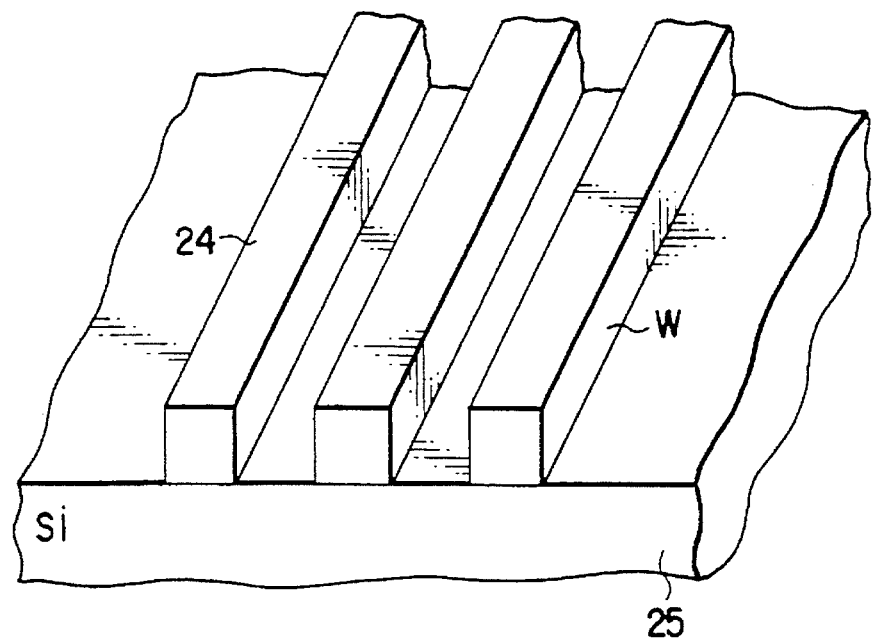
F I G. 5A
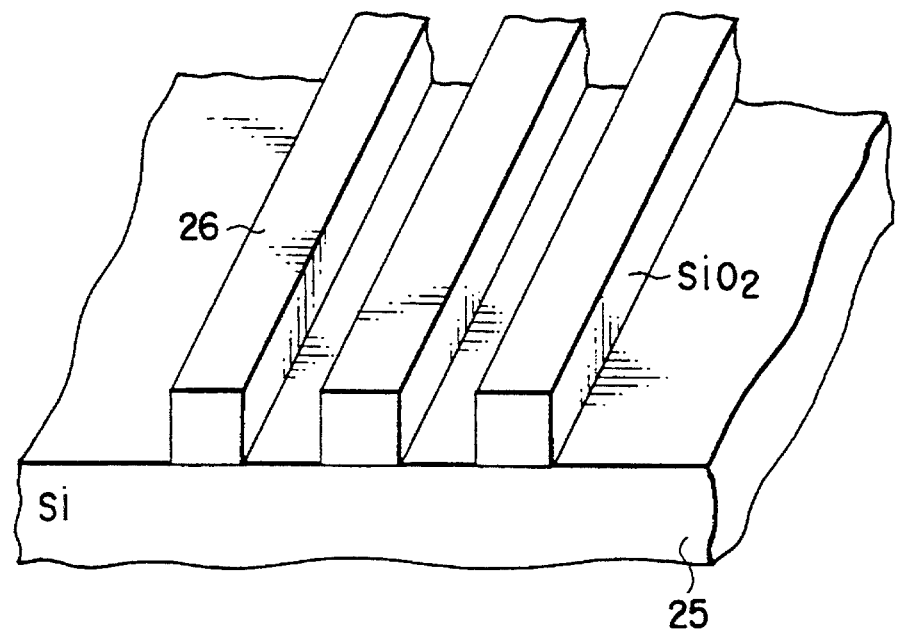
F I G. 5B

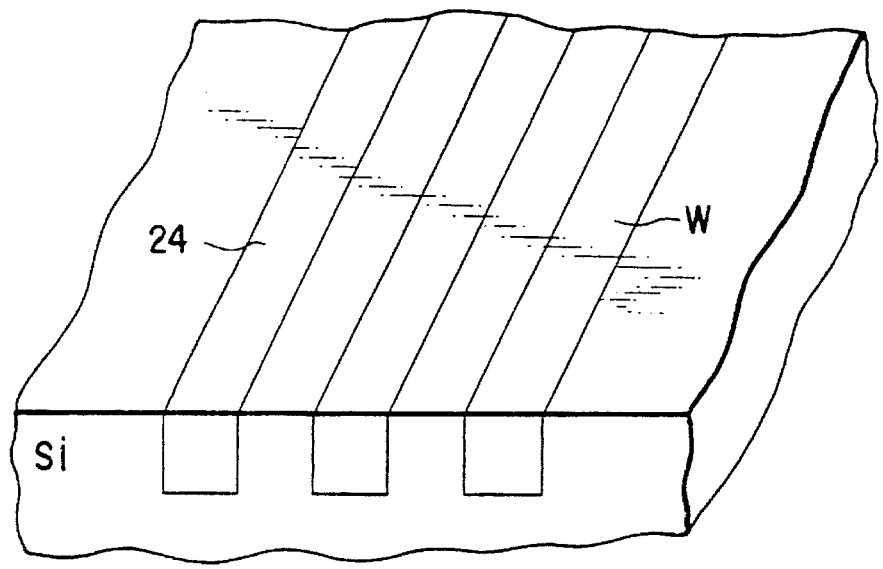
F I G. 6A
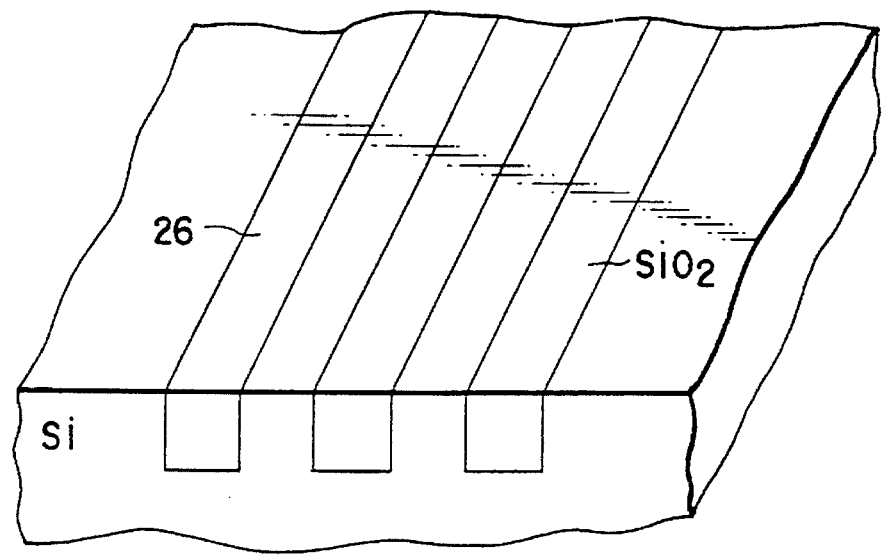
F I G. 6B

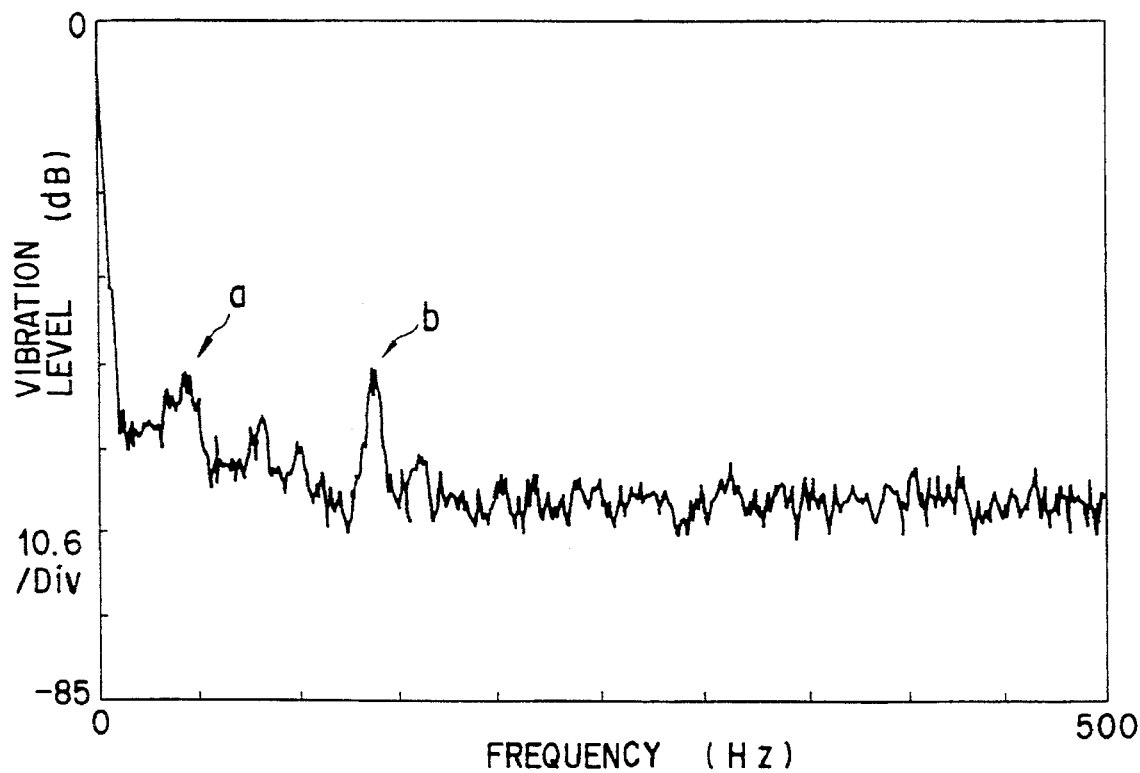
F I G. 8
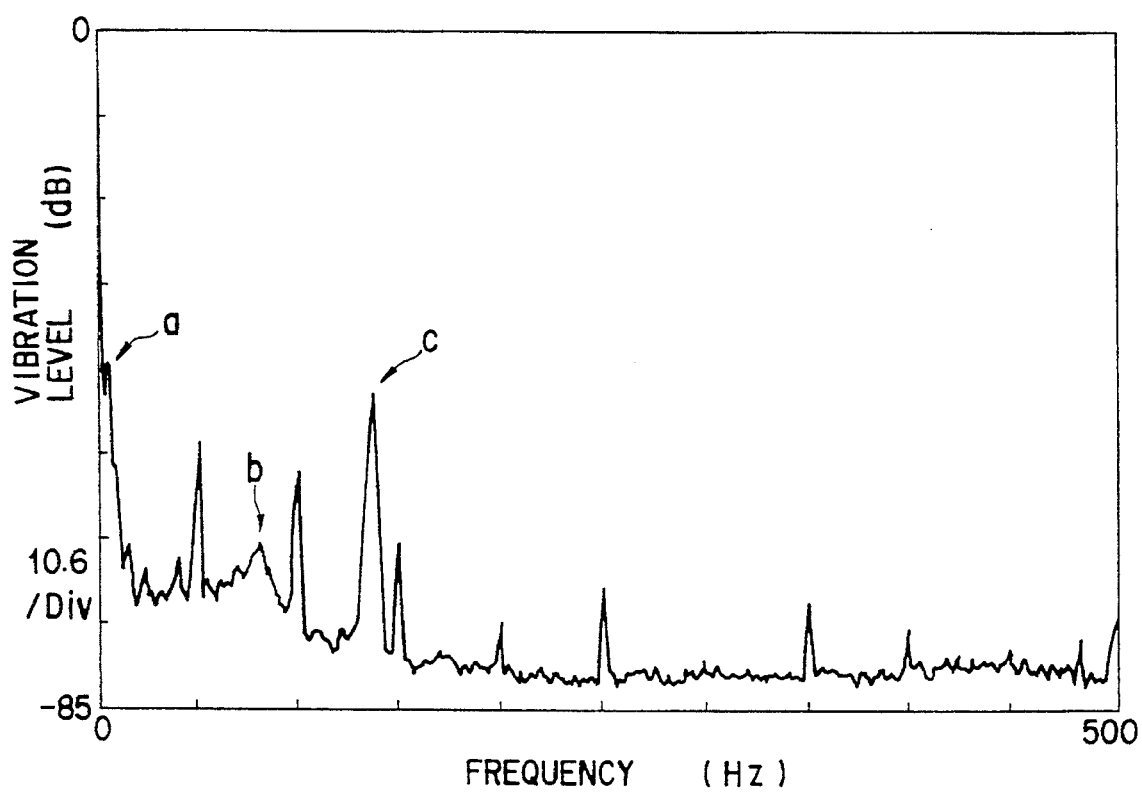
F I G. 9

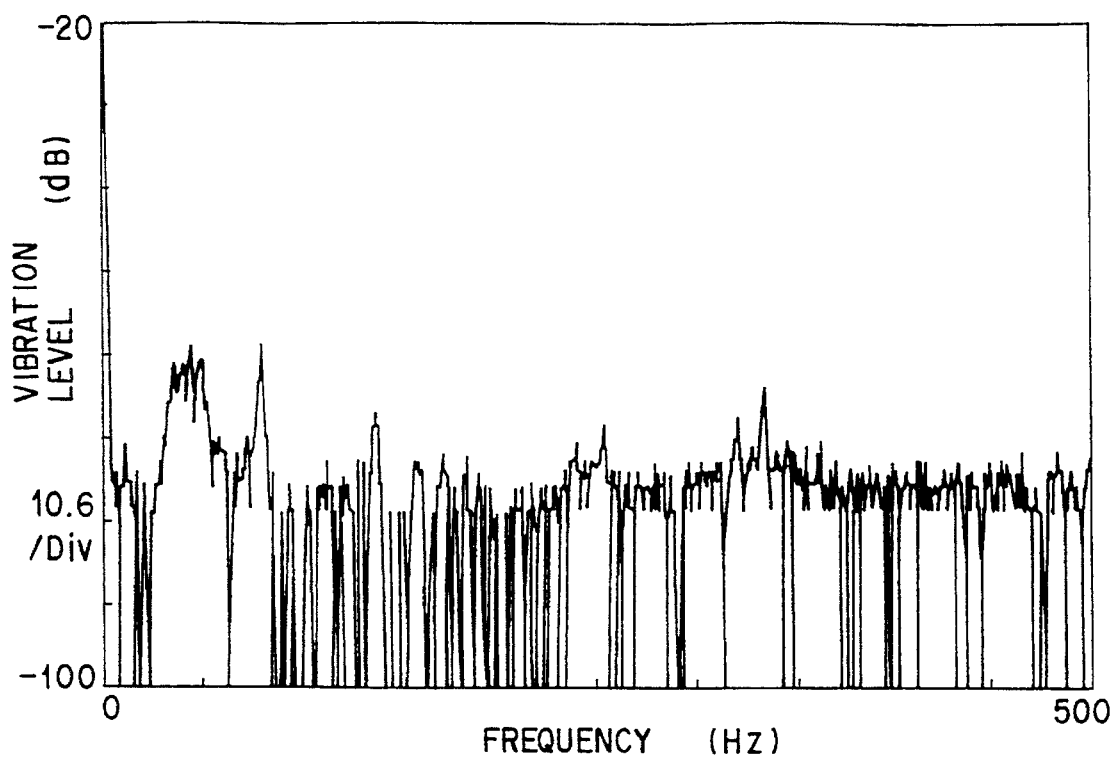
F I G. 11
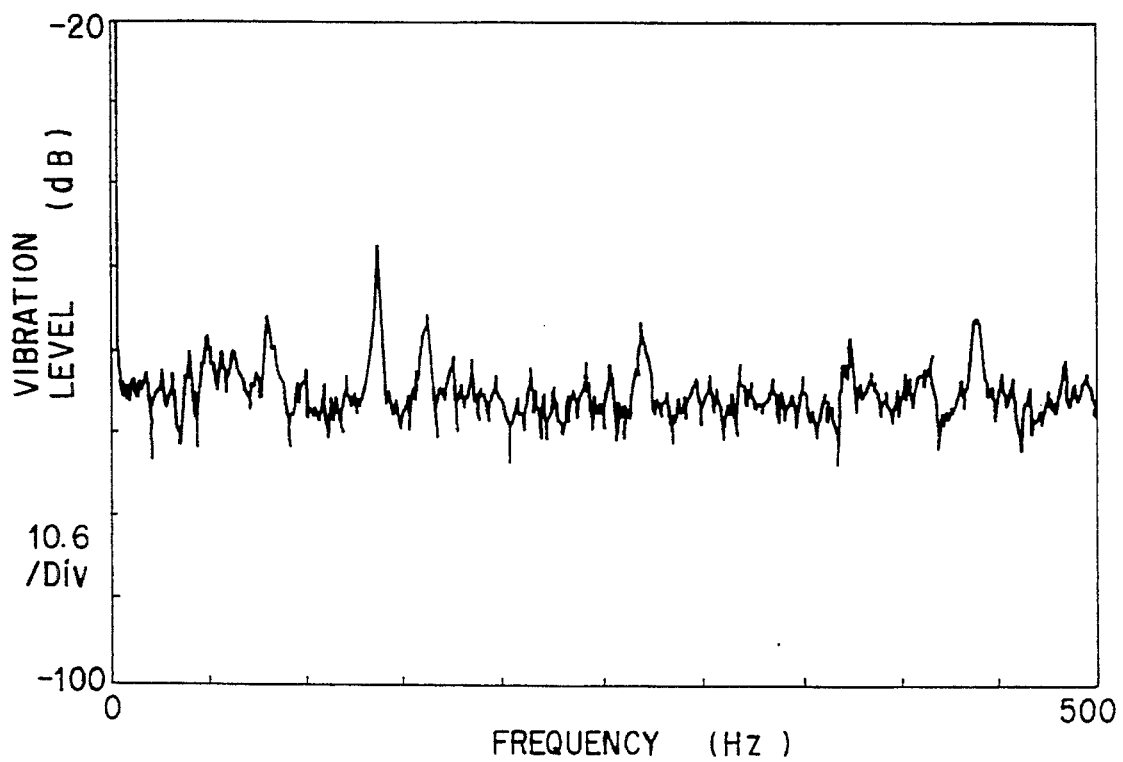
F I G. 12

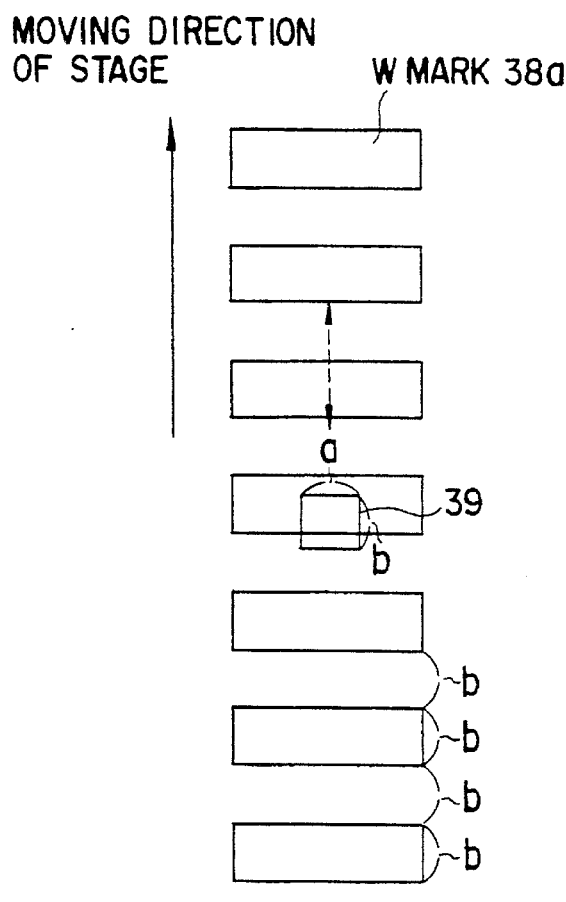
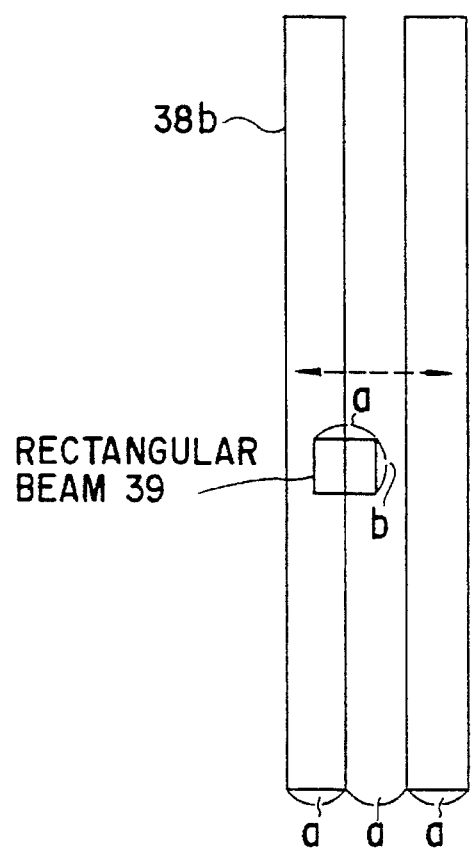
FIG. 13A
FIG. 13B
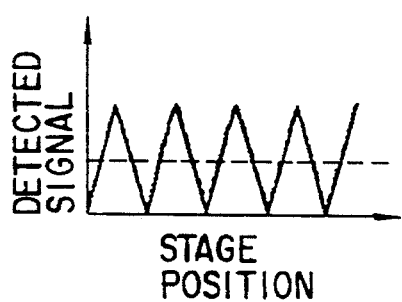
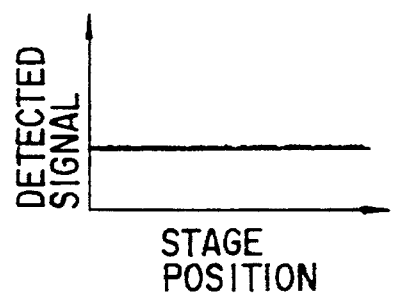
FIG. 13C
FIG. 13D

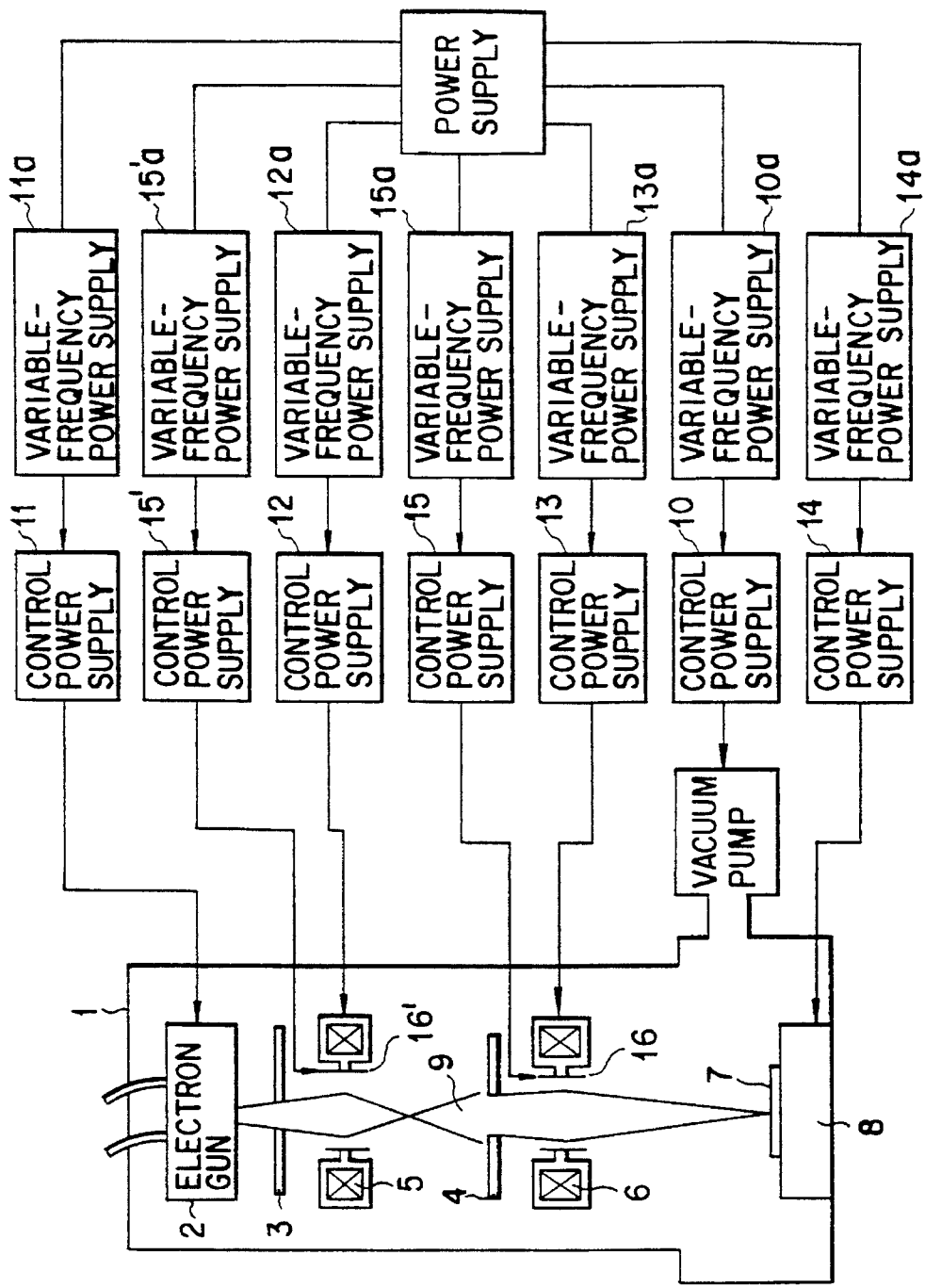
F I G. 14

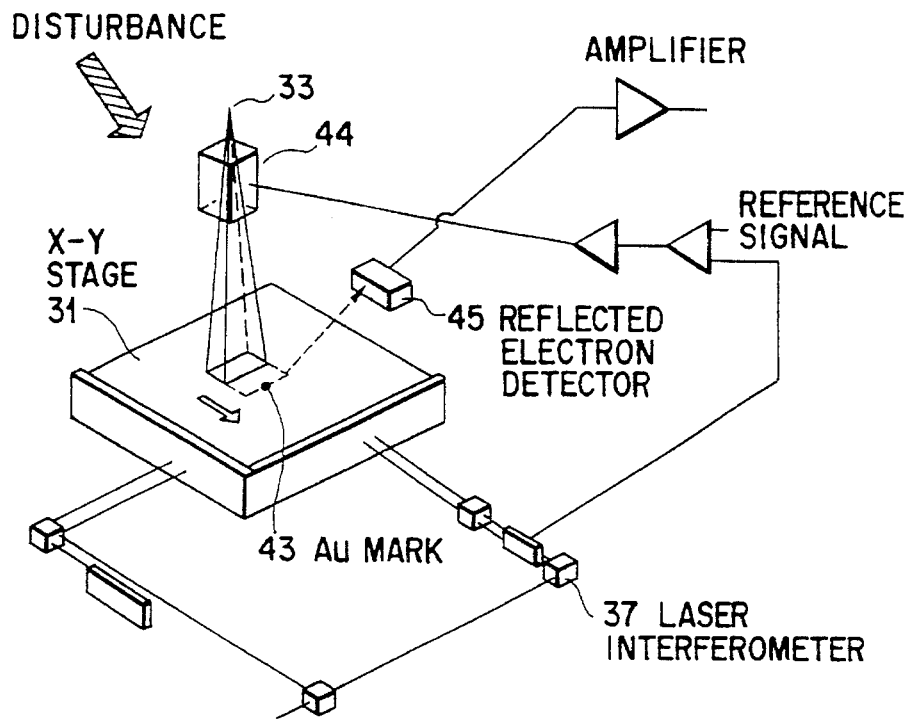
F I G. 15
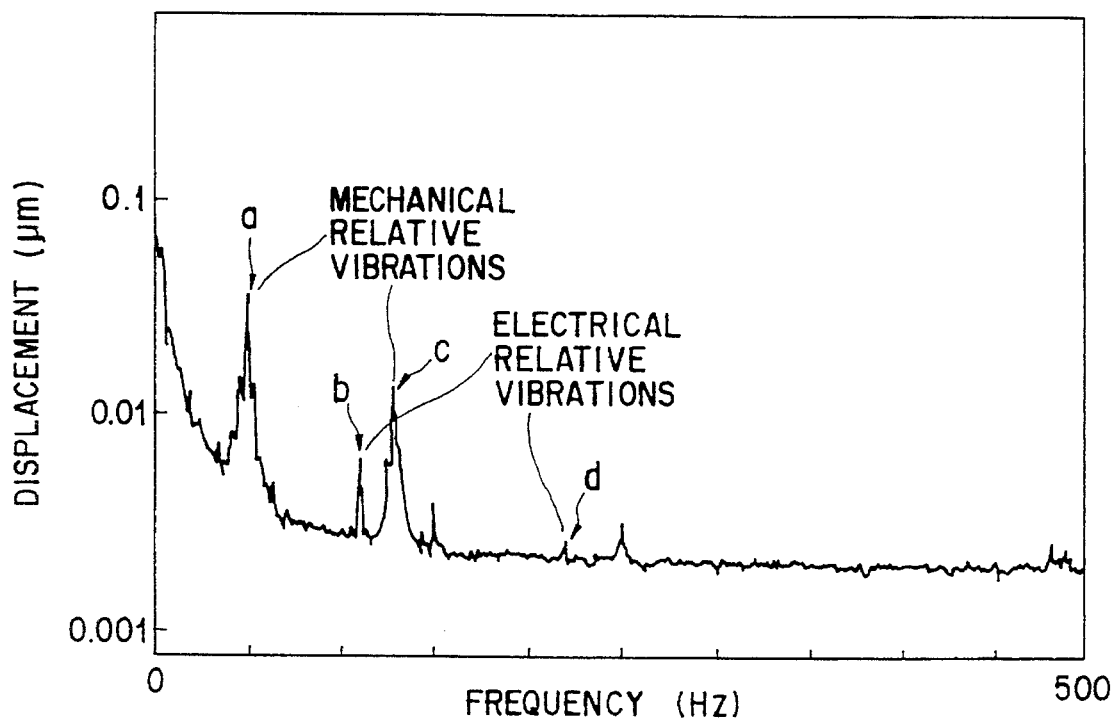
F I G. 16

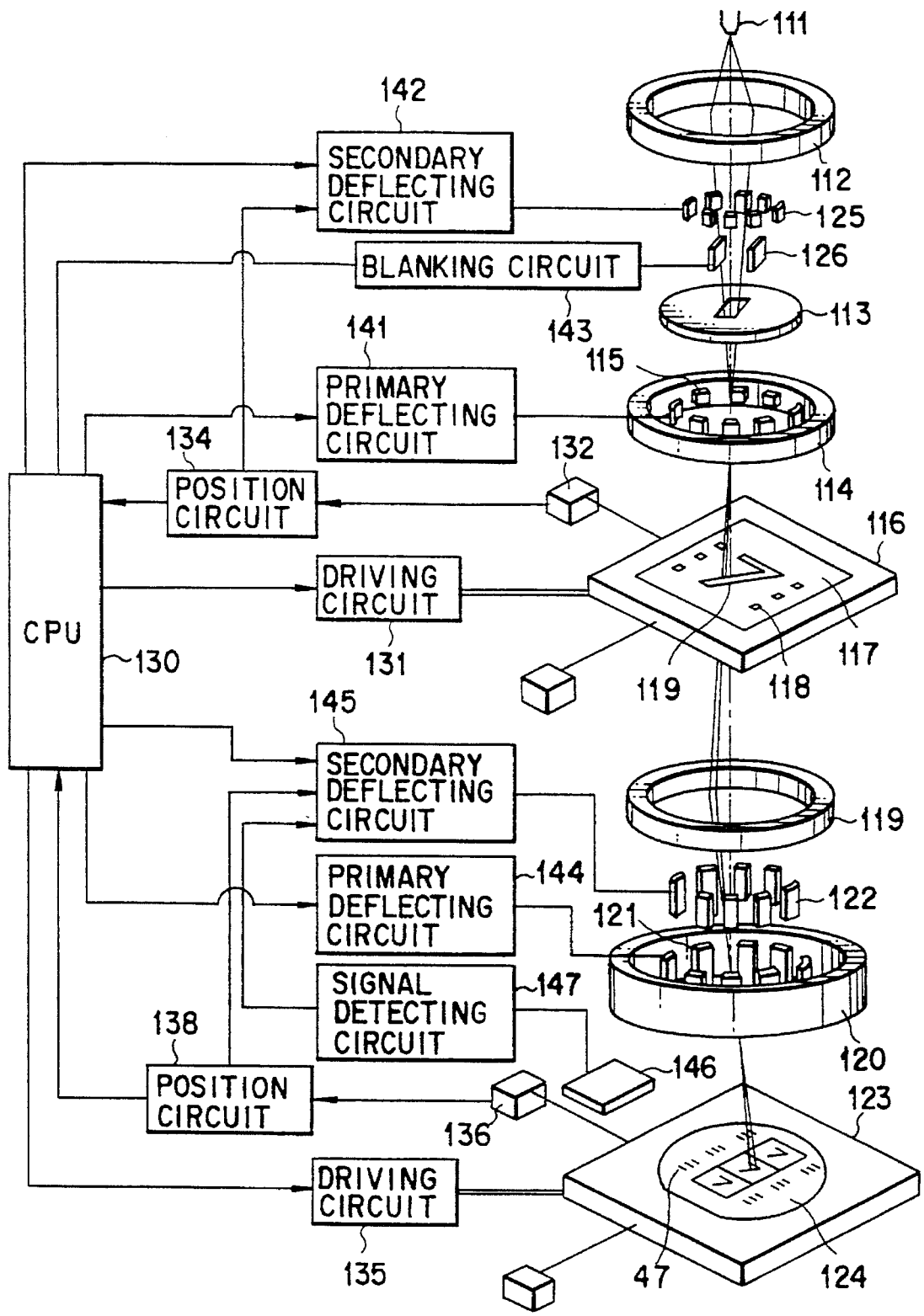
F I G. 19

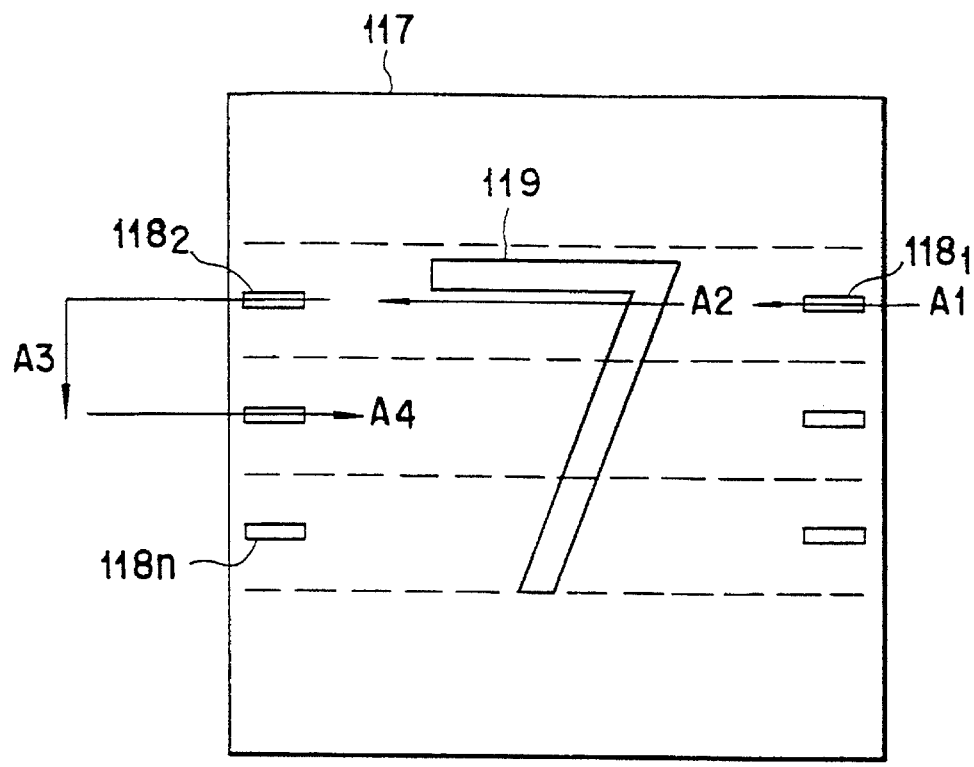
F I G. 20
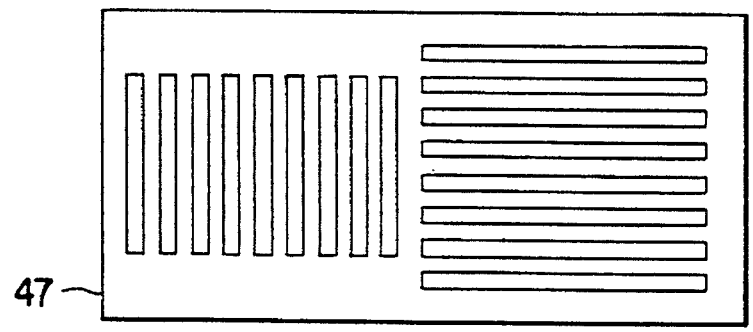
F I G. 21

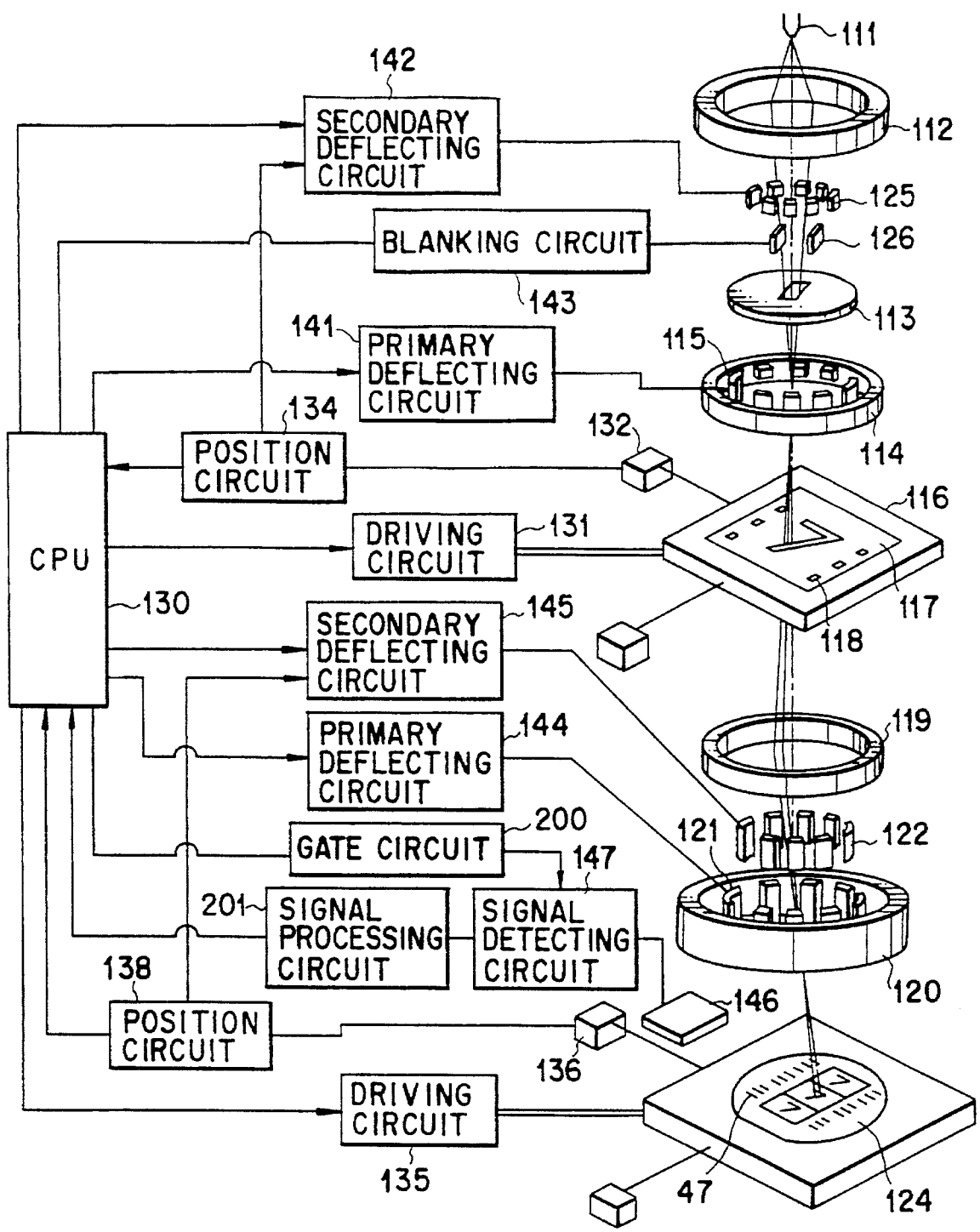
F I G. 23

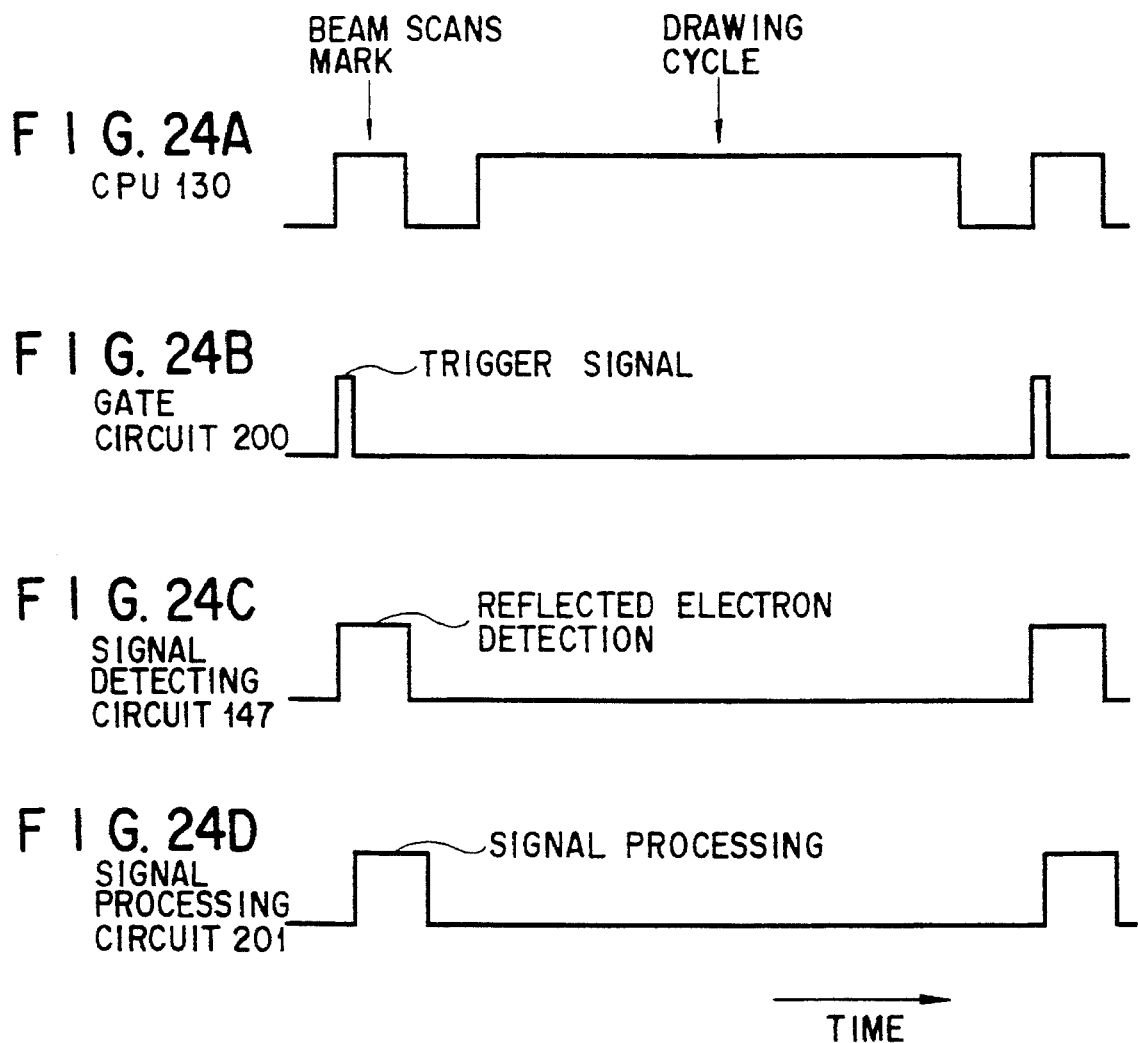

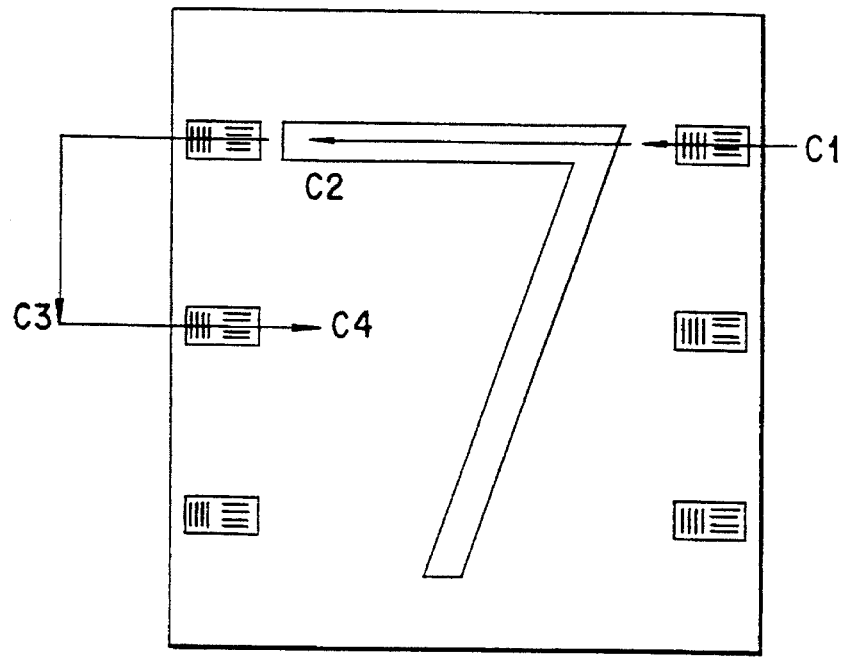
F I G. 25A
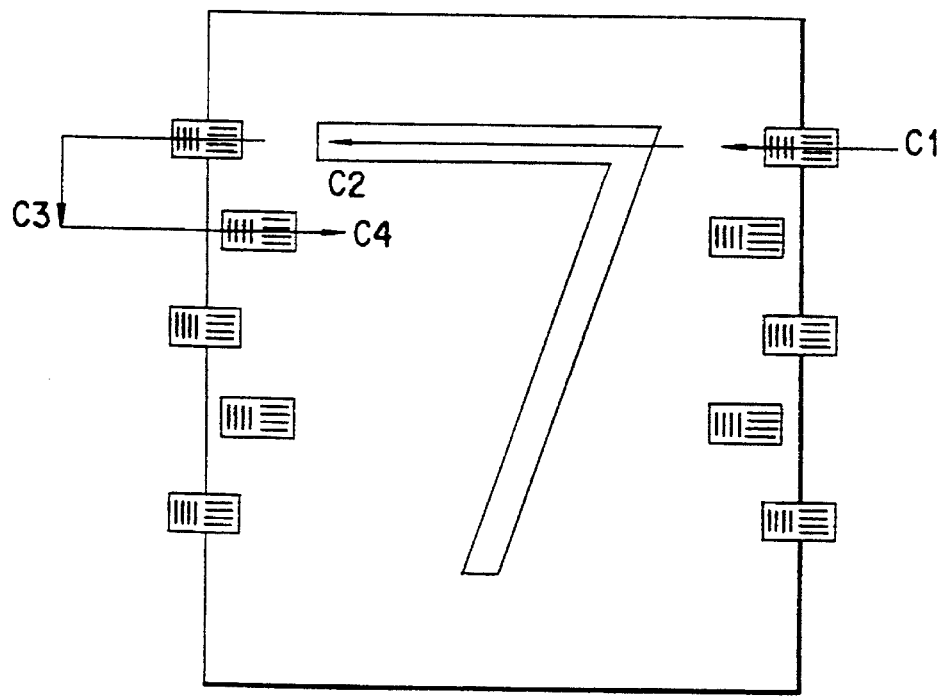
F I G. 25B

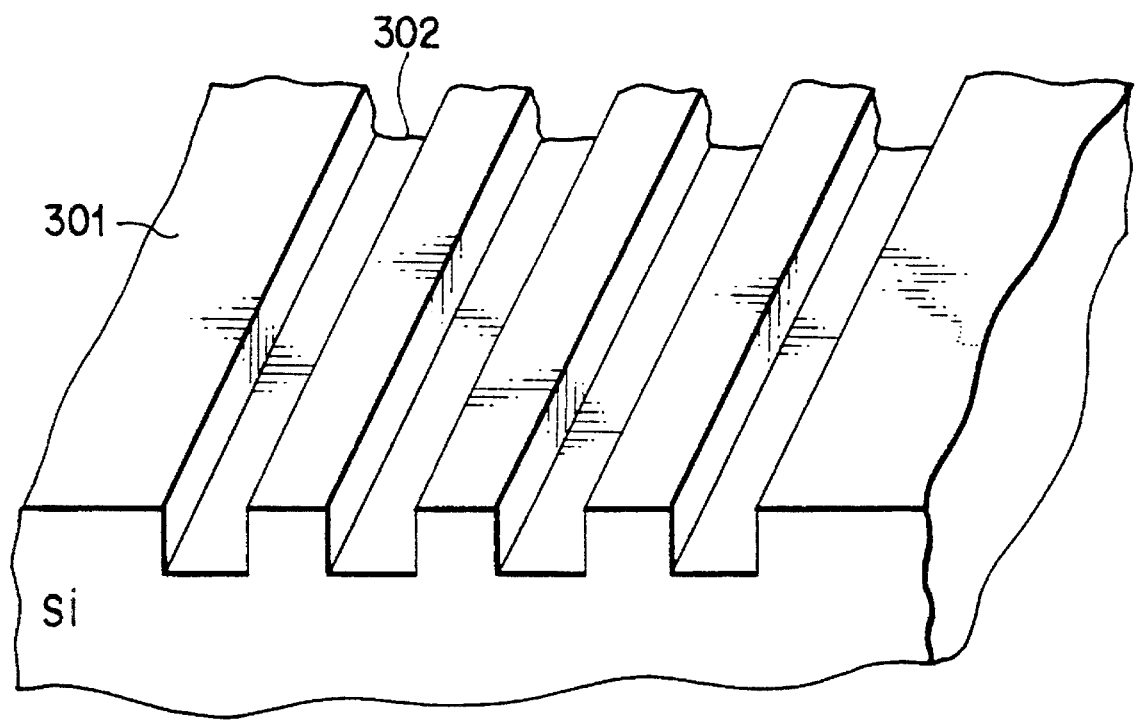
F I G. 26

CHARGED BEAM DRAWING APPARATUS

BACKGROUND OF THE INVENTION

1. Field of the Invention

The present invention relates to a charged beam drawing technique for drawing a fine pattern such as an LSI on a sample and, more particularly, to a displacement error measuring method which uses a charged beam to measure vibrations(relative displacement errors) occurring between the charged beam and a sample when the charged beam and the sample are moved, a charged beam drawing apparatus having a displacement error measuring function, and a semiconductor device which has a displacement error measuring mark and allows drawing of a desired pattern by compensating for relative displacement errors.

2. Description of the Related Art

Recently, as the degree of miniaturization and the packing density of semiconductor devices have been increased more and more, patterns to be formed on photoresist films also have been required to be finer patterns with a higher accuracy. Especially when such fine, high-accuracy patterns are necessary in, e.g., VLSIs, no desired patterns can be obtained by conventional methods of exposing patterns onto photoresist films by radiating light, since there is a limitation resulting from the wavelength of the light or the like. One method of solving this problem is to use an electron beam instead of light.

In an electron beam drawing apparatus, it is a common practice to draw a desired pattern on a sample by deflecting an electron beam while continuously moving a stage on which the sample is placed in one direction. In an electron beam drawing apparatus using this drawing method by continuous stage movement, vibrations of an X-Y stage have a large influence on the drawing accuracy. Therefore, the position of the X-Y stage is constantly measured by a laser interferometer, and, when the stage moves to a desired position, patterning is performed by sequentially shot-exposing a sample to an electron beam.

The development of an electron beam drawing apparatus of another type has advanced, in which the throughput is further increased by continuously moving not only a stage but a shaping mask for shaping an electron beam. That is, this electron beam drawing apparatus is a system for reducing and transfer-exposing a mask pattern onto the surface of a sample by using an electron beam, and comprises an aperture for shaping an electron beam emitted from an electron gun into a desired shape, means for radiating the charged beam shaped by the aperture onto a mask, means for reducing and projecting a region of the mask irradiated with the beam onto the surface of a sample, a mask stage for holding and moving the mask in a direction perpendicular to the axis of the beam, and a sample stage for holding and moving the sample in the direction perpendicular to the axis of the beam in synchronism with the mask stage. In this apparatus, the mask pattern is sequentially transferred to the surface of the sample.

An apparatus of the above kind, however, has the following problem. That is, if a relative vibration (either electrical or mechanical) that cannot be measured by a laser interferometer exists between the electron beam and the stage on which a sample is placed, this relative vibration cannot be compensated for. Consequently, the drawing accuracy becomes poor to make normal drawing impossible.

Such an unnecessary relative vibration can be measured by radiating an electron beam onto an edge of a fine mark which is placed on the stage and consists of, e.g., gold, and detecting reflected electrons produced upon the irradiation by using a detector. Furthermore, by reading the frequency of a vibration peak by analyzing the frequency of the resulting signal, it is possible to locate a portion posing a problem to some extent from the read frequency. Therefore, a certain counter-measure can be taken against the problem. This countermeasure, however, is limited to relative vibrations occurring while the stage is at rest, so no countermeasure can be taken against relative vibrations taking place while the stage is moved continuously. This is so because relative vibrations cannot be measured when the stage is moved.

FIGS. 1A to 1E are schematic views for explaining a conventional mark position detecting method. As shown in FIGS. 1A to 1E, a dot mark (Au mark) 27 consisting of a heavy metal such as gold is placed on the surface of a sample, and an electron beam (rectangular beam) 28 shaped into a rectangle is radiated on this mark. Since the amount of reflected electrons or secondary electrons produced changes in accordance with the overlap of the electron beam 28 and the mark 27, the signal amount detected by a detector changes accordingly. As shown in FIGS. 1A to 1D, during a period from the timing at which the electron beam 28 and the gold mark 27 begin overlapping each other to the timing at which they overlap completely, a certain relationship is established between the moving amount of the electron beam 28 and the detected signal amount in accordance with the shapes of the mark 27 and the electron beam 28. Therefore, the moving amount of the electron beam 28 can be determined from the detected signal amount. When the electron beam 28 is fixed to overlap the mark 27, a detection signal free from variations can be obtained ideally. If a relative vibration occurs between the electron beam 28 and the gold mark 27, the overlap of the beam and the mark changes, and this results in a change in the amount of reflected electrons. This makes it possible to measure the relative vibration between the electron beam 28 and the sample. In the above conventional method, however, this measurement cannot be performed while the sample is moved (while drawing is done) since it is impossible to keep radiating the electron beam 28 onto the gold mark 27 in that state.

SUMMARY OF THE INVENTION

The present invention has been made in consideration of the above situation and has as its object to provide a charged beam drawing apparatus capable of measuring relative vibrations occurring when a charged beam or a stage is moved continuously, thereby improving the drawing accuracy.

It is another object of the present invention to provide a displacement error measuring method using a charged beam, which can measure relative vibrations between the charged beam and a sample to thereby contribute to countermeasures against those vibrations.

It is still another object of the present invention to provide a semiconductor device with a displacement error measuring mark, which allows drawing by compensating for relative displacement errors between a charged beam and a sample.

According to an aspect of the present invention, there is provided a charged beam drawing apparatus comprising: means for drawing a desired pattern on a sample by deflecting a charged beam on the sample while continuously moving a stage on which the sample is placed; means for arranging on either the sample or the stage a mark having a line-and-space pattern in which a plurality of lines each having a width equal to a size of the charged beam on the sample are arranged with spaces each equal to the width therebetween; means for radiating the charged beam onto the mark while a position of the charged beam is fixed and at the same time continuously moving the stage in a longitudinal direction of the mark, thereby detecting a reflected beam of the charged beam from the mark; and means for measuring a relative vibration of the stage with respect to the charged beam during the continuous movement of the stage on the basis of a signal of the reflected beam.

According to another aspect of the present invention, there is provided a charged beam drawing apparatus comprising: means for drawing a desired pattern on a sample by deflecting a charged beam on the sample by using a charged beam optical system; a plurality of control circuits, arranged in the charged beam optical system, for controlling individual parts of the optical system and supplying power; means for selectively supplying to each one of the control circuits power with a frequency different from a frequency of power supplied to other control circuits; means for radiating the charged beam onto a mark arranged at a predetermined position on a stage on which the sample is placed, and detecting a reflected beam of the charged beam; and means for analyzing a frequency of a signal of the reflected beam and determining whether the control circuit is operating normally in accordance with whether an influence of the different frequency is detected in a peak frequency.

According to still another aspect of the present invention, there is provided a displacement error measuring method using a charged beam, comprising the steps of: shaping a charged beam into a predetermined shape by using a shaping mask; arranging repeatedly, as a displacement error measuring mark, shapes each having a descriptive correlation with the predetermined shape of the charged beam, at predetermined positions on either a sample or a stage on which the sample is placed; moving continuously at least one of the charged beam and the stage while radiating the charged beam onto the mark, and detecting a reflected beam from the mark produced by overlap of the charged beam and the mark; and obtaining a relative displacement error between the charged beam and the mark on the basis of a signal of the reflected beam.

According to still another aspect of the present invention, there is provided a charged beam drawing apparatus comprising: means for arranging repeatedly, as a displacement error measuring mark, shapes each having a descriptive correlation with a shape of a charged beam formed by a shaping mask, at predetermined positions on either a sample or a stage on which the sample is placed; means for moving continuously at least one of the charged beam and the sample while radiating the charged beam onto the mark, and detecting a reflected beam from the mark produced by overlap of the charged beam and the mark; means for measuring a relative displacement error between the charged beam and the mark on the basis of a signal of the reflected beam; and means for compensating for a beam position by feeding the relative displacement error back to a deflecting system for the charged beam.

According to still another aspect of the present invention, there is provided a semiconductor device with a displacement error measuring mark, comprising: means for arranging repeatedly as the displacement error measuring mark, shapes each having a descriptive correlation with a shape of a charged beam formed by a shaping mask, at predetermined positions on a surface to be drawn; means for moving continuously at least one of the charged beam and a sample while radiating the charged beam onto the mark, and detecting a reflected beam from the mark produced by overlap of the charged beam and the mark; means for measuring a relative displacement error between the charged beam and the mark on the basis of a signal of the reflected beam; means for compensating for a beam position by feeding the measured relative displacement error back to a deflecting system for the charged beam; and means for drawing a desired circuit pattern by using the compensated charged beam.

Desirable conditions of the present invention are as follows.

(1) The mark is formed by arranging a plurality of line marks each having a width equal to a side of the shaped beam with equal spaces between them. When relative displacements in a direction perpendicular to the moving direction of a sample stage are to be measured by using this mark, line marks arranged parallel to the moving direction of the sample stage are used. When relative displacements in the same direction as the moving direction of the sample stage are to be measured, line marks arranged perpendicular to the moving direction of the sample stage are used.

(2) The mark is made of a heavy metal.

(3) The mark is constituted by a difference between geometrical shapes, i.e., projections and recesses such as steps.

(4) The mark is made of a substance with an electron reflectance or a secondary electron emission coefficient different from that of a substance around the mark.

(5) The mark is arranged around a beam scan deflection region on the surface of a sample.

(6) The mark is arranged at a given position in a beam scan deflection region on the surface of a sample, e.g., outside a pattern region in a circuit pattern.

(7) The signal produced by the overlap of the mark and the shaped beam is detected by the detector in synchronism with the radiation of the beam onto the mark for a period during which the mark and the shaped beam overlap each other.

(8) The beam position is compensated for by feeding the detected relative displacement signal back to a primary deflector or a secondary deflector of the charged beam drawing apparatus.

(9) The beam position is compensated for by feeding the detected relative displacement signal back to a driving circuit of the beam shaping mask or the sample stage.

(10) A relative displacement between the beam and the mark is measured while the beam shaping mask and a sample are moved in synchronism with each other, and the beam position is compensated for by feeding the amount of the measured relative displacement back to at least one of the primary deflector and the secondary deflector.

(11) A relative displacement error between a beam shaped by the shaping mask and a sample in motion is measured, and the beam position is compensated for by feeding the amount of the measured displacement back to at least one of the primary deflector and the secondary deflector.

(12) A relative displacement error between a round beam which is shaped by an aperture mask and rasterscanned and a sample which is moved continuously is measured, and the beam position is compensated for by feeding the amount of the measured displacement back to at least one of the primary deflector and the secondary deflector.

(13) A portion of a circuit pattern is used as the mark.

The gist of the present invention is to improve the mark pattern or the control power supply to make it possible to measure relative vibrations (either electrical or mechanical) taking place between a stage which is being moved continuously and an electron beam. In the present invention, relative displacement errors which occur between a charged beam shaped by a mask and a sample upon exposure and which cannot be measured by a meter such as a laser interferometer of a charged beam drawing apparatus can be measured in real time by using the displacement error measuring mark in which shapes each having a descriptive correlation with the shape of the charged beam are repeatedly arranged. This uncovers an unnecessary relative vibration component produced by the continuous movement of the stage. Therefore, a portion posing a problem can be located, so a certain countermeasure against that problem can also be taken. This makes highly accurate drawing possible. In addition, according to the present invention, it is readily possible to measure electrical relative vibrations occurring between an electron beam and a stage while the charged beam drawing apparatus is performing drawing. Consequently, an unnecessary relative vibration produced by the continuous movement of the stage is unveiled. Since this makes it possible to locate a portion posing a problem, a certain countermeasure can be taken against that problem. As a result, high-accuracy drawing can be performed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1E are schematic views for explaining a conventional mark position detecting method;

FIG. 2 is a block diagram showing an electron beam drawing apparatus according to the first embodiment of the present invention;

FIGS. 5A and 5B are perspective views each showing an example of a projecting mark as the mark for use in the first embodiment;

FIGS. 6A and 6B are perspective views each showing an example of a buried mark as the mark for use in the first embodiment;

FIG. 8 is a graph showing the result of the frequency analysis of relative vibrations between an electron beam and a stage when the stage is moved continuously;

FIG. 9 is a graph showing the result of the frequency analysis of relative vibrations between an electron beam and a stage when the stage is at rest;

FIG. 11 is a graph showing the result of the frequency analysis performed by using an acceleration pickup mounted on a stage;

FIG. 12 is a graph showing the result of the frequency analysis of a signal performed by a laser interferometer;

FIGS. 13A and 13B are views showing the patterns of displacement error measuring marks used in the first embodiment;

FIGS. 13C and 13D are graphs showing the detection results of the mark patterns shown in FIGS. 13A and 13B, respectively;

FIG. 14 is a block diagram showing the arrangement of an electron beam drawing apparatus according to the second embodiment of the present invention;

FIG. 15 is a perspective view showing a measuring method of analyzing the frequencies of relative vibrations between an electron beam and a stage;

FIG. 16 is a graph showing an example of the measurement result in the second embodiment;

FIG. 19 is a block diagram showing the arrangement of an electron beam drawing apparatus according to the fourth embodiment of the present invention;

FIG. 20 is a view showing the relationship between the pattern and the rectangular holes of a mask used in the fourth embodiment;

FIG. 21 is an enlarged view showing the vibration measuring mark used in the fourth embodiment;

FIG. 23 is a block diagram showing the arrangement of an electron beam drawing apparatus used in the fifth embodiment of the present invention;

FIGS. 24A to 24D are timing charts for explaining the operation of the electron beam drawing apparatus used in the fifth embodiment shown in FIG. 23;

FIGS. 25A and 25B are views each showing an example of the arrangement of marks of a semiconductor device according to the fifth embodiment;

FIG. 26 is a perspective view showing the structure of a mark used in a displacement error measuring method according to the sixth embodiment of the present invention.

DETAILED DESCRIPTION OF THE PREFERRED EMBODIMENTS

Figures 3A, 3B, 3C:
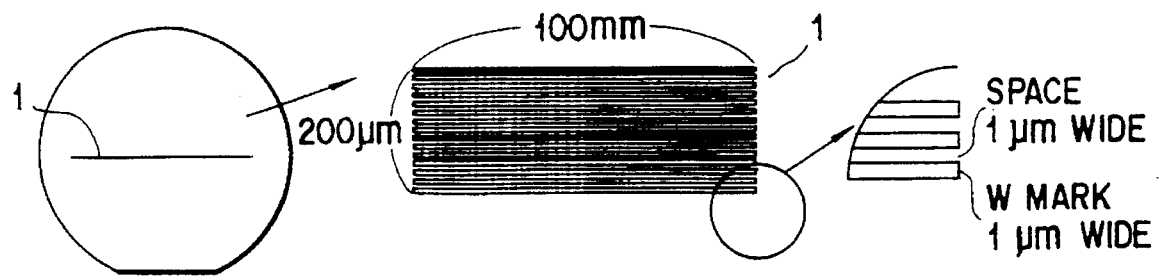
FIGS. 3A to 3C are schematic views for explaining the structures of marks used in the first embodiment.
Figures 3D, 3E, 3F:
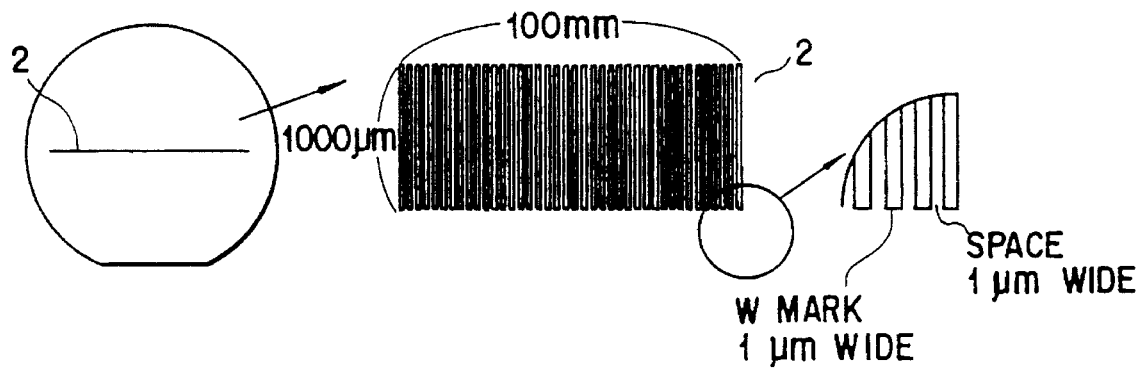
Figure 3G:
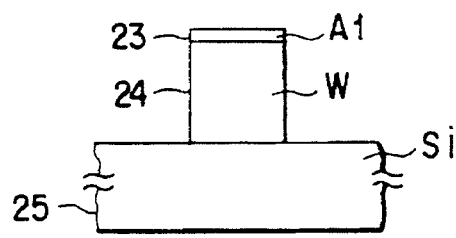

The embodiments of the present invention will be described in detail below with reference to the accompanying drawings.

(Embodiment 1)

FIG. 2 is a block diagram showing the arrangement of an electron beam drawing apparatus according to the first embodiment of the present invention. Referring to FIG. 2, reference numeral 1 denotes a vacuum tank; 2, an electron gun; 3 and 4, apertures; 5 and 6, electron lenses; 7, a sample substrate; 8, an X–Y stage; 9, an electron beam; 10 to 15, control power supplies; and 16 and 16', deflectors. In the vacuum tank 1, the electron beam 9 radiated from the electron gun 2 is properly converged by the electron lens 5 after the section of the beam 9 is shaped by the aperture 3. Thereafter, the section of the electron beam 9 is again shaped by the aperture 4, and the resulting electron beam 9 is focused by the electron lens 6 on the surface of a resist film formed on the surface of the substrate 7 placed on the X–Y stage 8 which is continuously moving. Although not shown in FIG. 2, the position of the X–Y stage 8 is measured constantly by a laser interferometer. When the continuously moving stage 8 moves to a desired position, patterning is performed by sequentially shot-exposing the substrate 7 to the electron beam 9.

FIGS. 3A to 3C are schematic views each showing the structure of a mark used in the first embodiment. A line-and-space mark (to be referred to as a mark hereinafter) 1 shown in FIG. 3A is formed on the entire surface of a wafer for a measurement purpose and used to detect relative vibrations between the electron beam and the stage 8 in a direction perpendicular to the moving direction of the stage 8. When this mark 1 is to be measured by using a 1-μm beam, the mark 1 is made from a heavy metal such as tungsten in such a manner that at least two lines, each having a side of 1 μm in the direction perpendicular to the continuous moving direction of the stage and extended in the continuous moving direction of the stage, are formed with spaces each equal to the width of the rectangular beam between them. A mark 2 illustrated in FIG. 3B is used to detect relative vibrations between the electron beam and the stage in the same direction as the moving direction of the stage. The structure of the mark 2 is essentially identical with that of the mark 1 shown in FIG. 3A except for the direction of arrangement of lines. The sectional structure of each of the marks 1 and 2 is as shown in FIG. 3C. That is, a 0.2-μm thick W film 24 and a 0.02-μm thick $Al_2O_3$ film (or Al film) 23 to be used as an etching mask are stacked on an Si substrate 25.

Figure 4A:
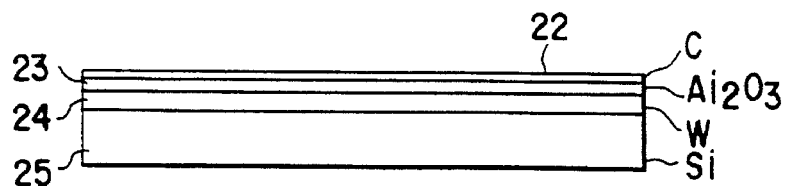
FIGS. 4A to 4G are sectional views showing a process of manufacturing the marks used in the first embodiment.
Figure 4B:
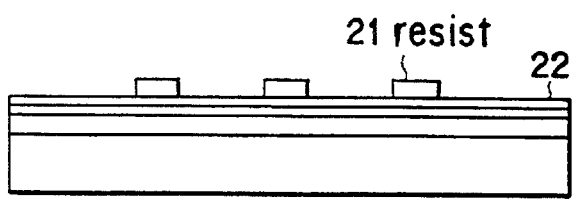
Figure 4C:
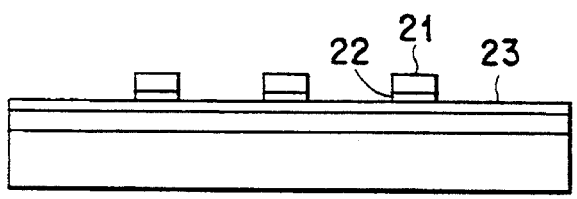
Figure 4D:
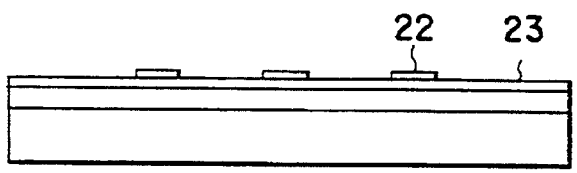
Figure 4E:
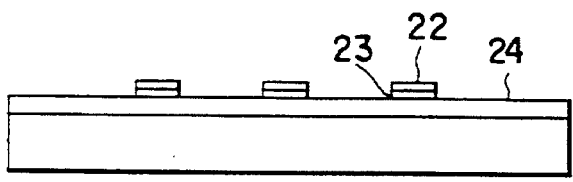
Figure 4F:
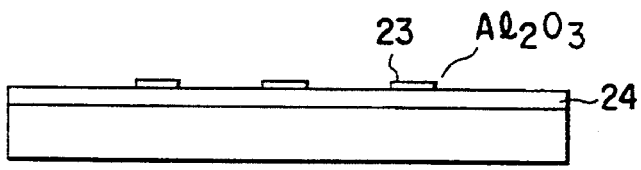
Figure 4G:
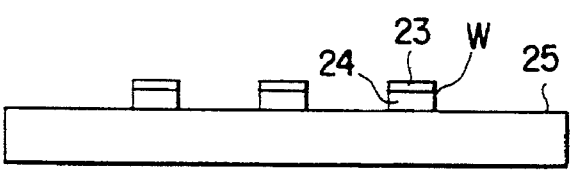

FIGS. 4A to 4G are sectional views showing a process of manufacturing the marks used in the first embodiment. This manufacturing process of the marks 1 and 2 will be described below with reference to FIGS. 4A to 4G. First, as shown in FIG. 4A, the W film 24, the $Al_2O_3$ film 23, and a C film 22 are formed in this order on the Si substrate 25. The formation of the W film 24 and the $Al_2O_3$ film 23 is performed by using a magnetron sputtering apparatus (SDH-5215RD). More specifically, the W film 24 is formed by feeding Ar gas at a pressure of 0.4 Pa at which the stress of the film is minimized and performing DC sputtering at a power of 1 kW. The $Al_2O_3$ film 23 is formed by RF sputtering at an Ar gas pressure of 0.4 Pa and a power of 1.5 kW. The C film 22 is formed to prevent the $Al_2O_3$ film 23 from being dissolved during alkali development of a resist (to be described later). Subsequently, as shown in FIG. 4B, a resist 21 is coated to form a desired resist pattern. The formation of the resist pattern is done by using, e.g., an EB drawing apparatus and, e.g., SAL601-ER (Shipley Corp.) as the resist 21. Thereafter, as shown in FIG. 4C, the C film 22 is selectively etched by RIE by using the resist 21 as a mask. The resist 21 is then peeled as shown in FIG. 4D, and the $Al_2O_3$ film 23 is selectively etched by RIE by using the C film 22 as a mask as shown in FIG. 4E. The peeling of the resist 21 is performed by CDE using a gas mixture of $O_2$ and $CF_4$. In this CDE, the $O_2$ and $CF_4$ flow rates are set at 500 and 20 sccm, respectively, and the power is set at 600 W. The etching of the $Al_2O_3$ film 23 is performed by a magnetron RIE apparatus (HiRRIE200x) by using $BC_{l3}$ gas at a pressure of 2 Pa and a power of 150 W. Subsequently, after the C film 22 is removed as shown in FIG. 4F, the W film 24 is selectively etched by RIE by using the $Al_2O_3$ film 23 as a mask, as shown in FIG. 4G. The etching of the W film 24 is done by a parallel plate RIE apparatus (DEM-451) by using a gas mixture of $SF_6$ and $CHF_3$. In this etching, the $CHF_3$ and $SF_6$ flow rates are set at 26 and 10 sccm, respectively, the pressure is set at 1.3 to 8 Pa, and the RF power is set at 30 to 100 W.

Consequently, as shown in FIG. 5A, the line-and-space displacement error measuring marks 24 basically consisting of the W film are formed on the Si substrate 25. Note that W is used as the material of the mark in this first embodiment, but it is naturally possible to use another heavy metal material such as Au. In addition, as shown in FIG. 5B, it is also possible to form marks 26 on the Si substrate 25 by using an oxide film consisting of, e.g., $SiO_2$ which is frequently used as a semiconductor material. That is, any material can be used as the mark provided that the material is different in reflected electron amount from a substance surrounding the mark.

It is also obvious from the reason explained above that the marks need not be the projecting marks shown in FIGS. 5A and 5B but may be buried marks 24 and 26 formed by burying a W film and an oxide film of, e.g., $SiO_2$ in the Si substrate 25 as shown in FIGS. 6A and 6B, respectively. When the projecting marks are used, electron beam collide against the projections, so the amount of the reflected electrons is sometimes influenced by a factor other than relative displacement errors between an electron beam and a sample. When the buried marks are used, in contrast, relative displacements between an electron beam and a sample can be measured more accurately since there is no projection.

Figure 7:
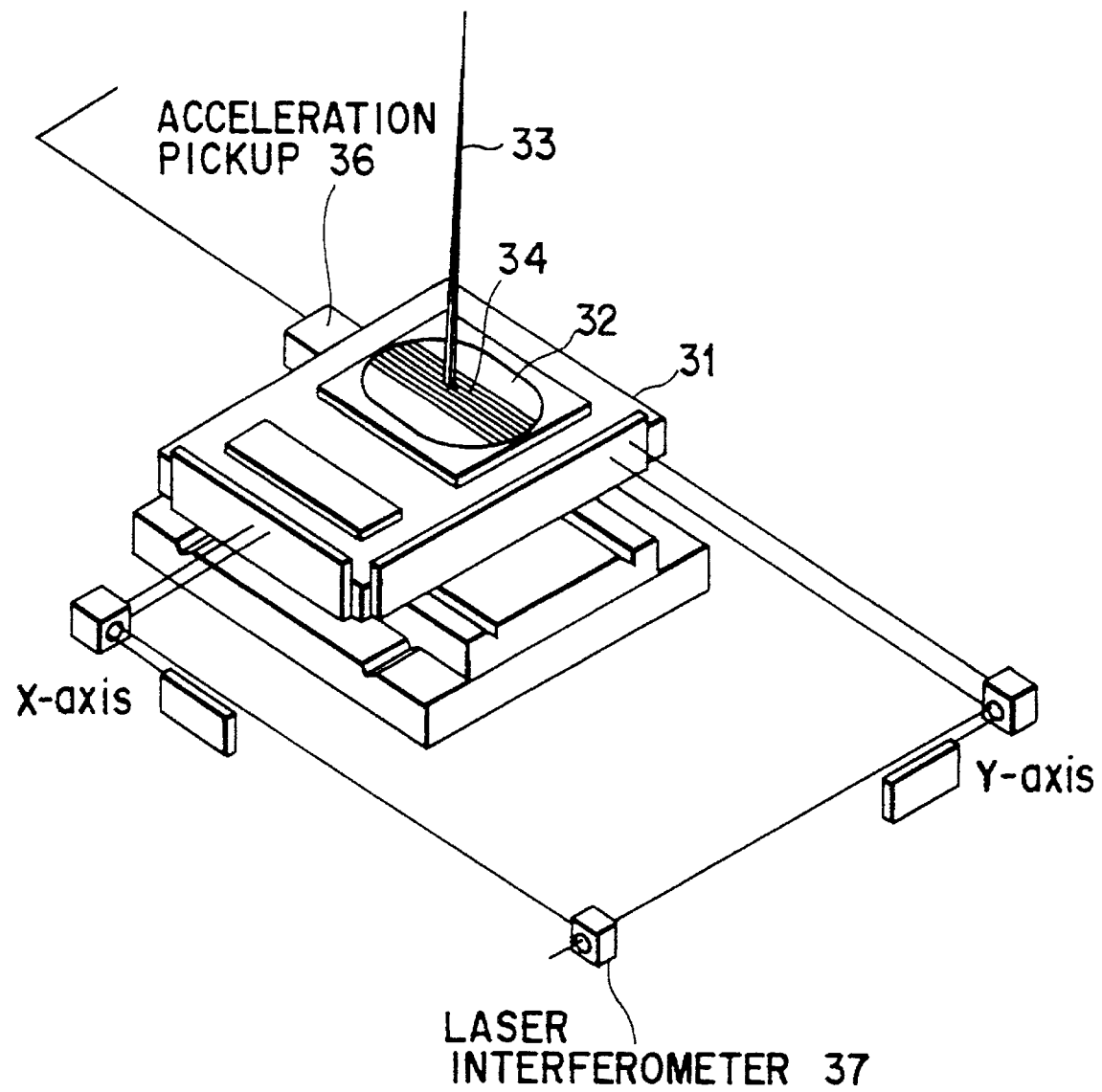
FIG. 7 is a perspective view showing a measuring method of analyzing the frequencies of relative vibrations between an electron beam and a stage.

FIG. 7 is a perspective view showing a measuring method of analyzing the frequencies of relative vibrations between an electron beam and a stage. A location at which a mark 34 manufactured as described above is fixed will be described below. The mark 34 is fixed on a portion of an X–Y stage 31 such that the surface of the mark 34 is held at the same level as a sample 32 to be drawn. The fixing location (position) can be anywhere within the stroke range of the X–Y stage 31. The position of the mark 34 is not limited to the surface of the X–Y stage 31. For example, the mark 34 can be formed on the sample 32 which is loaded on the X–Y stage 31, or a wafer on which the mark is formed can be used instead of the sample 32. The sample 32 to be drawn illustrated in FIG. 7 is a wafer on the entire surface of which the mark 34 is formed for a measurement purpose. The mark 34 may also be formed on a sample holder for holding the sample 32. An electron beam 33 in a fixed state is radiated vertically onto the mark 34, and a reflected electron detector detects reflected electrons while the X–Y stage 31 is continuously moved in the longitudinal direction of the line of the mark 34.

A method of measuring relative vibrations of the X–Y stage 31 by using the marks shown in FIGS. 3A and 3B will be described below. By using the marks 1 and 2 each having the same width as that of the rectangular electron beam 33 as shown in FIGS. 3A and 3B, it is possible to measure relative vibrations between the electron beam 33 and the X–Y stage 31 when the X–Y stage is moved in directions parallel to and perpendicular to the lines of the marks. As an example, a 1-µm wide line-and-space pattern is fixed on the X–Y stage 31. While the electron beam 33 with a diameter of 1 µm which is equal to the line width is radiated on the pattern, a reflected electron signal generated when the X–Y stage 31 is continuously moved at a predetermined speed is detected.

FIGS. 8 and 9 are graphs showing examples of the results of the frequency analysis of relative vibrations between the electron beam and the X–Y stage detected when the X–Y stage was continuously moved and at rest, respectively. FIG. 8 shows that relative vibrations took place in a portion a near 45 Hz and in a portion b near 140 Hz. FIG. 9 shows the result of an identical measurement performed while the movement of the X–Y stage was stopped. In FIG. 9, peaks are present in a portion a near 10 Hz, a portion b near 80 Hz, and a portion c near 130 Hz. The peaks occurring periodically at every 50 Hz is caused by electrical noise. A peak is found near 45 Hz in the result when the X–Y stage 31 was moved, indicating that a relative vibration that was not produced when the X–Y stage 31 was at rest was brought about when the X–Y stage 31 was moved. In FIGS. 8 and 9, a vibration peak of 130 Hz is present. However, this is caused by the influence of noise produced by a vacuum pump. Therefore, the difference between the continuous movement of the X–Y stage 31 and the stop of the X–Y stage 31 is not clear.

Figure 10:
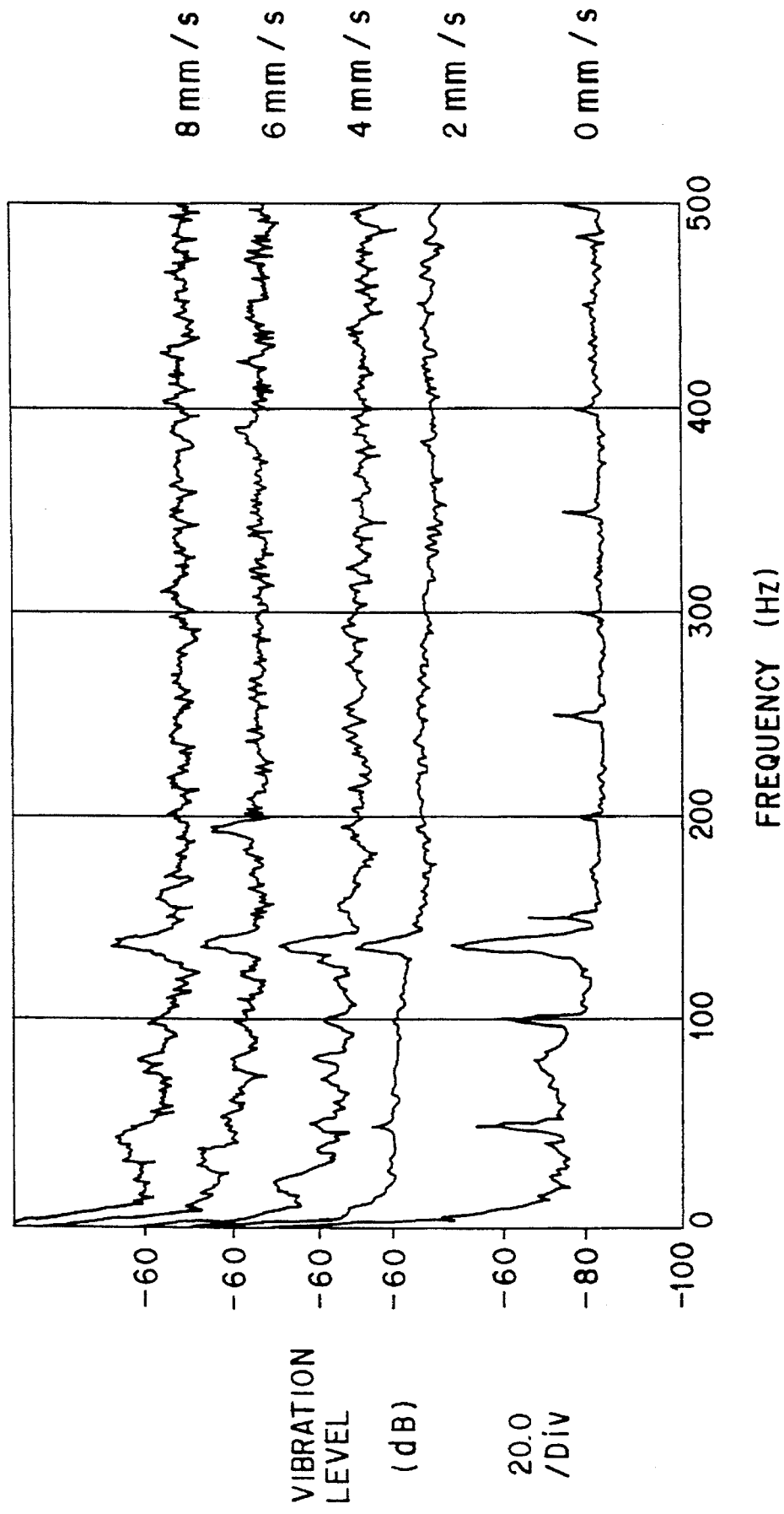
FIG. 10 is a graph showing the result of the frequency analysis of relative vibrations between an electron beam and a stage when the speed of the stage is changed.

FIG. 10 is a graph showing the results of the frequency analysis of relative vibrations between the electron beam and the stage when the speed of the stage was variable. FIG. 10 shows the results obtained by measuring relative vibrations between the beam and a sample while the moving speed of the X–Y stage 31 was varied as a parameter. In FIG. 10, the moving speeds of the stage 31 are 0, 2, 4, 6, and 8 mm/s. A vibration peak of 130 Hz is present in all results because the measurements were done by operating a vacuum pump. FIG. 10 reveals that moving the X–Y stage 31 produced a relative vibration component in a low-frequency region of 50 Hz or less. It is also found that this vibration component shifted as the stage speed increased. That is, it is possible from FIG. 10 to confirm relative vibrations existing between the beam and the sample, which vibrations were attributed only to continuous movement of the stage.

Simultaneously with the measurements using the reflected electron signal described above, the frequency of the signal from an acceleration pickup 36 shown in FIG. 7 which was mounted on the stage 31 was analyzed while the stage was moved. As a result, a peak was found at the same frequency as shown in FIG. 11. When the frequency of the signal from a laser interferometer 37 shown in FIG. 7 was similarly analyzed, no such peak was found as illustrated in FIG. 12.

It can be assumed from the above results that vibrations of the X–Y stage cannot be measured by the laser interferometer 37, so no feedback is performed for the electron beam, and consequently these vibrations appear as relative vibrations between the beam and the sample. Therefore, drawing errors can be reduced by examining and uncovering the causes by which these vibration components do not appear as vibrations detectable by the laser interferometer 37. It is possible to eliminate relative vibrations between the electron beam and the stage by performing the measurements as described above and, if there is any problem, removing the cause of the problem. This makes it possible to perform drawing at a high accuracy.

The displacement error measuring method according to the first embodiment of the present invention will be described in more detail below.

FIGS. 13A and 13B are views each showing a mark pattern for a displacement error measurement for use in the first embodiment. In the first embodiment, as shown in FIGS. 13A and 13B, in order to solve the above problem, the shapes of marks 38a and 38b are so determined that an electron beam 39 and the marks 38a and 38b are kept overlapped even if a sample is moved. FIG. 13A illustrates the mark 38a for measuring relative displacement vibrations between the electron beam 39 and the mark in a direction parallel to the continuous moving direction of the stage. FIG. 13B illustrates the mark 38b for measuring relative displacement vibrations between the electron beam 39 and the mark in a direction perpendicular to the continuous moving direction of the stage. Assuming that the shape of the electron beam 39 is a rectangle (lateral side: a, longitudinal side: b), the line mark 38a shown in FIG. 13A has a width of b, and these line marks 38a are repeatedly arranged with a spacing (mark pitch) of b between them for the distance the stage 31 moves. The length of the line mark 38a need only be one by which fluctuations of the X–Y stage 31 during movement can be covered, and by which the electron beam 39 and the line marks 38a overlap each other at any instant within the moving range of the stage 31 even if the moving axis of the stage is inclined from the line marks 38a, thereby making detection of a reflected electron signal possible. The mark 38b shown in FIG. 13B, on the other hand, has a width of a, and a spacing between these lines marks 38b is also a. The length of the line mark 38b corresponds to the moving distance of the stage 31. The number of line marks 38b must be one by which fluctuations of the stage during movement can be covered, and by which the electron beam 39 and the marks 38b overlap each other constantly within the moving range of the X–Y stage 31 even if the moving axis of the stage is inclined from the line marks 38b.

A method of detecting relative displacement vibrations between the rectangular beam 39 and the marks 38a and 38b will be described below. First, a method of measuring relative displacement vibrations between the electron beam 39 and the marks 38a in FIG. 13A in a direction parallel to the continuous moving direction of the stage will be described. The rectangular beam 39 with a lateral side of a and a longitudinal side of b is formed by shaping a beam through an electron beam optical tube and radiated on the marks 38a. Primary and secondary beam deflecting circuits are fixed in this state, and the X–Y stage 31 is moved in a direction perpendicular to the longitudinal direction of the marks 38a. Assuming that the X–Y stage 31 ideally moves under conditions that there is no mechanical vibration except for those in the moving direction and other structures are not excited by a reaction force caused by the movement, and that the marks 38a are perfectly perpendicular to the moving direction of the X–Y stage 31, the reflected electron signal varies in the form of a triangular wave at the mark traversing period of the rectangular electron beam 39, which is determined by the moving speed of the X–Y stage 31 and the mark pitch b. A method of measuring relative displacement vibrations between the electron beam 39 and the marks 38b in FIG. 13B in a direction perpendicular to the continuous moving direction of the stage will be described next. In an ideal case in which neither vibration nor disturbance exists, a constant reflected electron amount corresponding to the overlap of the electron beam 39 and the mark 38b and having no variation can be obtained regardless of the position of the X–Y stage 31.

In contrast, if the marks 38a are formed to be inclined from the moving direction of the stage 31, the electron beam 39 traverses the marks 38a as the stage 31 moves. Therefore, the reflected electron amount varies in the form of a triangular wave at the mark traversing period of the beam 39, which is determined by the speed of the stage 31 and the inclination of the marks 38a. In addition, in practical situations, the stage 31 finely vibrates in every direction while it moves. Therefore, the electron beam optical tube, for example, mechanically vibrates due to the reaction force generated by stopping the movement of the stage 31, and the electron beam 39 also changes its position due to an electromagnetic disturbance. When the X–Y stage 31 or the electron beam 39 vibrates, the actually detected signal becomes the one shown in FIG. 13C in which fine vibrations are superposed on a triangular wave. When the longitudinal direction of the marks 38b is parallel to the moving direction of the X–Y stage 31, as in the case of the vibration measurement using the marks 38a discussed earlier, the actually detected signal becomes the one shown in FIG. 13D in which fine vibrations are superposed on a signal at a predetermined level.

The use of the displacement error measuring methods of the present invention described above, therefore, makes it possible to check primarily mechanical relative vibrations between the electron beam 39 and the marks 38a and 38b in real time while the stage is moved. In addition, by checking the frequency component of the detected signal by performing frequency analysis or the like, it is possible to locate a portion having an influence on relative vibrations in the drawing apparatus.

Note that this first embodiment has been explained by taking the system in which the line-and-space marks are already incorporated into the apparatus as an example, but it is naturally possible to add the marks only when a maintenance is to be performed. In addition, the marks can also consist of a substance other than tungsten provided that signal detection is possible.

(Embodiment 2)

FIG. 14 is a block diagram showing the arrangement of an electron beam drawing apparatus according to the second embodiment of the present invention. Note that the same reference numerals as in FIG. 2 denote the same parts in FIG. 14, and a detailed description thereof will be omitted. In this second embodiment, control power supplies 10 to 15, 15' are connected to variable-frequency power supplies 10a to 15a, 15a', respectively, so that one particular power supply supplies power at a frequency different from those of other power supplies. For example, it is possible to drive only the control power supply 12 for an electron lens 5 at a frequency of 55 Hz by connecting it to the variable-frequency power supply 12a, while other parts are driven at a frequency of 50 Hz.

FIG. 15 is a perspective view showing a measuring method of performing a frequency analysis for relative vibrations occurring between an electron beam and a stage due to electrical noise produced by the individual power supplies. In this method, the drive frequency of one of the variable-frequency power supplies 10a to 15a, 15a' connected to the control power supplies 10 to 15, 15' is selectively changed in sequence. Reflected electrons obtained when an X–Y stage 33 is continuously moved are detected each time the drive frequency of one variable-frequency power supply is changed, and the frequency of the relative vibration between an electron beam 33 and the X–Y stage 31 is analyzed. This measuring method can determine which one of the control power supplies 10 to 15' produces electrical noise having an influence on relative vibrations. In FIG. 15, reference numeral 43 denotes a circular Au mark for reflecting the electron beam; 44, a deflecting system for deflecting the electron beam; and 45, a reflected electron detector. Note that this second embodiment will be explained by taking a system in which the variable-frequency power supplies 10a to 15a, 15a' are already incorporated into an apparatus as an example, but it is naturally possible to add the variable-frequency power supplies only when a maintenance is to be performed.

FIG. 16 is a graph showing an example of the measurement result obtained by the measuring method shown in FIG. 15. FIG. 16 illustrates the result obtained by measuring electrical noise by setting the drive frequency of the variable-frequency power supply 15a for the deflector power supply 15 at 55 Hz and those of the other variable-frequency power supplies at a line power frequency of 50 Hz. Referring to FIG. 16, a harmonic component of 110 Hz which is twice the variable frequency of 55 Hz and another harmonic component of 220 Hz which is four times the variable frequency of 55 Hz are observed at peak frequencies indicated by b and d, respectively. Even when this variable frequency was changed slightly, harmonic components which were even-numbered multiples of the changed frequency were observed. It is expected from this result that the control power supply 15' of the deflector power supply 15 had a problem in, e.g., its ground parts. Therefore, examinations need only be made concentrically for the control power supply 15' to solve this problem. Note that it was confirmed from other measurements that the peak frequencies indicated by a and c in FIG. 16 were caused by mechanical relative vibrations.

By performing the above measurements for all the control power supplies and, if there is any problem, removing the cause of that problem, it is possible to eliminate electrical ones of relative vibrations between the electron beam and the stage. Consequently, drawing can be performed at a high accuracy. That is, according to this second embodiment, it is possible to perform high-accuracy drawing in which the causes of relative vibrations between the electron beam and the stage derived from some electrical factors can be readily located.

(Embodiment 3)

Figure 17:
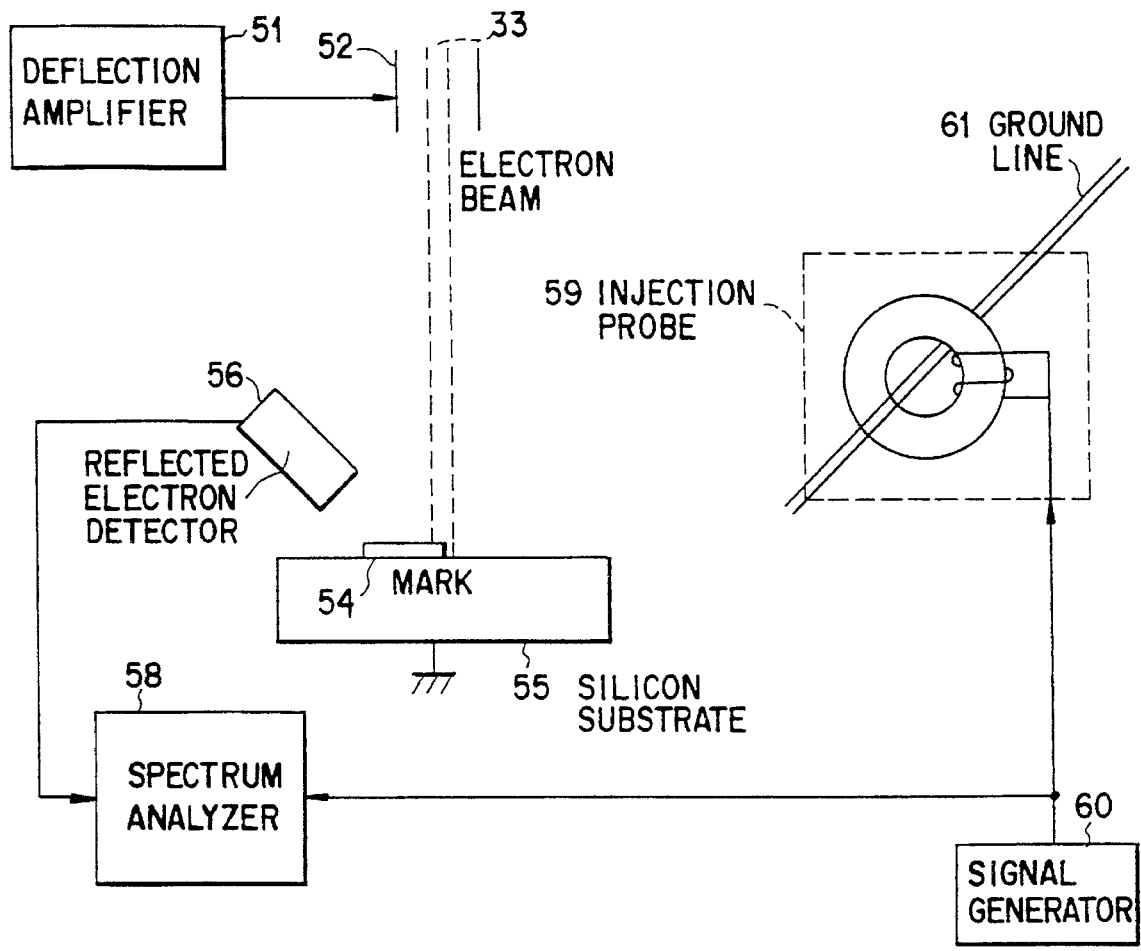
FIG. 17 is a block diagram showing an arrangement for performing electron beam vibration detection according to the third embodiment of the present invention.

FIG. 17 is a block diagram showing an arrangement for performing electron beam vibration detection according to the third embodiment of the present invention. In this third embodiment, line wiring is improved in order to detect noise of a ground line 61, a signal line (not shown), and a power line (not shown) of a drawing apparatus, thereby preventing the occurrence of noise. The main electron beam vibration frequencies of an electron beam drawing apparatus are a power supply frequency of 50 (or 60) Hz and its harmonic components of 100 (or 120) Hz, 150 (or 180) Hz, 200 (or 240) Hz... Among other frequencies, 50 (or 60) Hz as a fundamental wave is the main component. An electron beam 33 is vibrated by the electrical noise. The rectangular electron beam 33 is radiated by a deflection amplifier 51 and a deflection electrode 52 at a position on a silicon substrate 55 at which one-half of the electron beam covers a mark 54. The reflectance of the mark 54 with respect to the radiated electron beam is different from that of the silicon substrate 55; i.e., the reflectance of the mark 54 is higher than that of the silicon substrate 55. Although the reflectance changes in accordance with, e.g., the material or the thickness of the mark 54, it is assumed that the reflectance of the silicon substrate 55 is zero and that of the mark 54 is 1 for simplicity.

Figure 18:
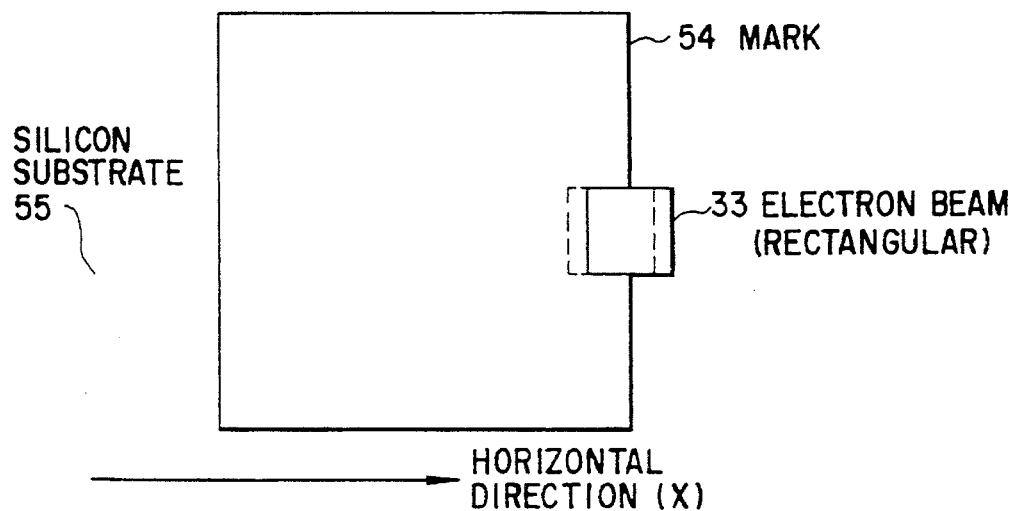
FIG. 18 is a view showing the positional relationship between an electron beam and a mark in the third embodiment.

Suppose the area of the rectangular electron beam 33 is A. The amount of reflected electrons entering a reflected electron detector 56 when the rectangular electron beam 33 is so radiated that one-half of the beam covers the mark 54 as indicated by a solid line in FIG. 18 is half that when the rectangular electron beam 33 is radiated entirely on the mark 54. When the one-half of the rectangular electron beam 33 is radiated on an edge of the mark 54 and the electron beam 33 is vibrated by noise, the reflected electron amount is modulated by the noise. The reflected electrons modulated by the noise can be detected by using the reflected electron detector 56, and the amplitude and the frequency of the reflected electrons can be measured by using a spectrum analyzer (or an oscilloscope) 58. If the scale of a system is large, however, it is very difficult to locate a noise source from which noise is mixed. Therefore, a signal having an amplitude and a frequency slightly different from those of noise is generated by a signal generator 60 and is selectively applied in sequence to the signal line, the power line, and the ground line 61 through an injection probe 59. At the same time, the output signal from the signal generator 60 is supplied to the spectrum analyzer 58. The spectrum analyzer 58 compares the output signal from the reflected electron detector 56 with the output signal from the signal generator 60. In a line free from the influence of noise, neither the amplitude nor the frequency component of the output signal from the signal generator 60 is observed in the output signal from the reflected electron detector 56. In a line under the influence of noise, however, the amplitude and the frequency component of the output signal from the signal generator 60 are observed in the output signal from the reflected electron detector 56.

Assume that noise (a noise current $I_{earth}$) with a frequency of 55 Hz which is close to the power supply frequency is injected from the injection probe 59 into the ground line 61 of the electron beam drawing apparatus. The vibration of the rectangular electron beam 33 at this time, i.e., a rectangular beam vibration $A_{earth}$ of the injected noise component, is detected by the reflected electron detector 56. Likewise, noise components which generate noise currents $I_{signal}$ and $I_{line}$ are injected into the signal line and the power line, respectively, and the resulting vibrations of the rectangular electron beam 33 are measured. That is, a vibration $A_{signal}$ of the rectangular electron beam 33 corresponding to the noise current $I_{signal}$ injected into the signal line is measured, and a vibration $A_{line}$ of the beam 33 corresponding to the noise current $I_{line}$ injected into the power line is measured. Thereafter, ratios $A_{earth}/I_{earth}$, $A_{signal}/I_{signal}$, and $A_{line}/I_{line}$ of the noise currents injected into the ground line 61, the signal line, and the power line to the respective corresponding vibrations of the rectangular electron beam 33 are calculated. The influence of noise is large in a line having a high ratio.

Although the above explanation relates to the detection of horizontal (X) components, vertical (Y) components can also be detected by positioning the rectangular electron beam 33 in an upper portion of the mark 54. In addition, the same effect can be obtained for a point electron beam as well as the rectangular electron beam 33. Even when the electron beam 33 is scanned, the scan frequency is modulated by noise, so the above measurements can be similarly performed by detecting this modulated component. Furthermore, the power supply frequency is used in this third embodiment, but identical measurements can be performed even if noise has a higher frequency.

In a large-scale apparatus such as an electron beam drawing apparatus, several hundreds or more of signal lines, power lines, and ground lines are used. It is therefore nearly impossible for conventional methods to locate a line which produces noise to cause vibrations of an electron beam. As discussed earlier, however, the method of the present invention can readily locate a noise source by injecting noise at a predetermined frequency into each line and measuring the influence of that line.

(Embodiment 4)

FIG. 19 is a block diagram showing the arrangement of an electron beam drawing apparatus according to the fourth embodiment of the present invention. This fourth embodiment discloses an electron beam drawing apparatus capable of improving the drawing accuracy by compensating for relative vibrations (relative displacements) in real time by using the relative displacement detecting method mentioned earlier. The fourth embodiment will be described in detail below by taking an electron beam drawing apparatus of a continuous beam shaping mask stage and wafer stage movement type as an example. In FIG. 19, reference numeral 121 denotes a primary deflector for positioning the image of a mask 117 on a wafer 124; 122, a secondary deflector (high-speed deflector) used to perform alignment between the mask 117 and the wafer 124; and 123, a wafer stage movable in a direction perpendicular to the axis of a beam with the wafer 124 mounted on it. The arrangement of an optical system will be described first. Referring to FIG. 19, an electron beam emitted from an electron gun 111 is adjusted to have an appropriate current density by a condenser lens 112 and radiates a beam shaping aperture 113. The aperture 113, i.e., the shaped beam, is radiated on the mask 117 by a projecting lens 114. The radiation position of this aperture image is moved by a beam shaping deflector 115. A plurality of rectangular holes 118 are formed together with a chip pattern in the mask 117. These rectangular holes 118 are rectangular openings used to form a rectangular beam of a variable size and to perform vibration measurement. A beam pattern formed by the overlap of the image of the mask 117 on which the image of the aperture 113 is radiated, i.e., the beam image of the aperture 113 and the rectangular opening is reduced and projected onto the wafer 124 by a reducing lens 119 and an objective lens 120.

The arrangement of a control system will be described below. A mask stage 116 is driven by a driving circuit 131 which is operated by commands from a central processing unit (CPU) 130. The mask stage 116 is moved in a direction perpendicular to the direction of the beam axis. The moving position of the mask stage 116 is detected by a laser interferometer 132 and a position circuit 134. The obtained detection information is supplied to the CPU 130 and a secondary deflecting circuit 142 (to be described later). Note that the laser interferometer 132 radiates laser light onto the mask stage 116 and measures its position on the basis of an output signal obtained by detecting the reflected light. The wafer stage 123 is driven by a driving circuit 135 which is operated by commands from the CPU 130. The wafer stage 123 is moved in the direction perpendicular to the direction of the beam axis. The moving position of the wafer stage 123 is detected by a laser interferometer 136 and a position circuit 138. The obtained detection information is supplied to the CPU 130 and a secondary deflecting circuit 145 (to be described later). The primary beam shaping deflector 115 is applied with a deflection voltage from a primary 10 deflecting circuit 141 which is controlled by the CPU 130. A secondary beam shaping deflector 125 is applied with a deflection voltage from a secondary deflecting circuit 142 which receives the position information from the CPU 130 and the position circuit 134. Consequently, the primary deflector 115 moves the aperture image on the mask 117, and the secondary deflector 125 compensates for the position of the aperture image in accordance with the difference between the theoretical position and the actual position of the mask stage 116. Likewise, the primary deflector 121 is applied with a deflection voltage from a primary deflecting circuit 144, and the secondary deflector 122 is applied with a secondary deflection voltage from a secondary deflecting circuit 145. Consequently, the primary deflector 121 moves the mask image of a small region on the wafer 124, and the secondary deflector 122 compensates for the position of the mask image in accordance with the difference between the theoretical position and the actual position of the wafer stage 123. Note that reference numeral 126 denotes a blanking deflector for turning on and off the beam; 143, a blanking circuit for applying a blanking voltage to the blanking deflector 126; 146, a reflected electron detector; and 147, a signal detecting circuit.

The movements of the mask and the wafer, exposure, and vibration compensation will be described below. The 10 mask stage 116 and the wafer stage 123 are moved in synchronism with each other. As shown in FIG. 20, a pattern opening 119 and the rectangular beam shaping openings 118 are formed in the mask 117. The beam shaping openings $118_1, 118_2, \ldots, 118_n$ are formed as a stripe the size of which is determined in consideration of the reduction ratio in order to form a rectangular beam of a predetermined size for use in vibration measurement. As shown in the enlarged view of FIG. 20, the movement of the radiation position of the electron beam on the surface of the mask 117 is as indicated by arrows A. More specifically, an arrow $A_1$ indicates a state in which the mask stage 116 is continuously moved to form a rectangular beam to search for marks 47 on the surface of the wafer 124. An arrow $A_2$ indicates a drawing state. An arrow $A_3$ indicates a state in which the mask stage 116 performs step movement. An arrow $A_4$ indicates a state in which the rectangular beam is again formed to perform the mark search. The mark 47 for vibration measurement is formed on the wafer 124 to have a shape shown in an enlarged view of FIG. 21. The movement of the radiation position of the rectangular beam on the surface of the wafer 124 is illustrated in an enlarged view of FIG. 22A. More specifically, an arrow $C_1$ indicates a state in which mark search is performed by a rectangular beam formed by the rectangular opening $118_1$ of the mask 117. An arrow $C_2$ indicates a state in which a pattern is drawn by an electron beam passing through the pattern opening 119 of the mask 117. An arrow $C_3$ indicates step movement, and an arrow $C_4$ indicates a state in which the mark search is again performed. A method of measuring relative vibrations by using the vibration measuring marks 47 formed on the wafer 124 is identical with that of the embodiment mentioned earlier.

Figure 22A:
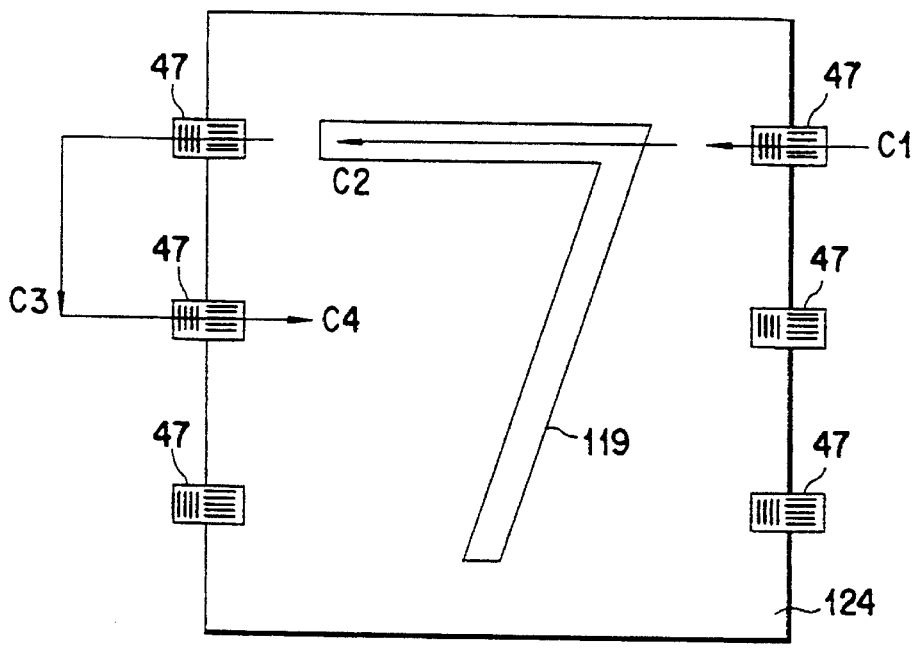
FIGS. 22A and 22B are views each showing the movement of the radiation position of a rectangular beam on the surface of a sample in the fourth embodiment.
Figure 22B:
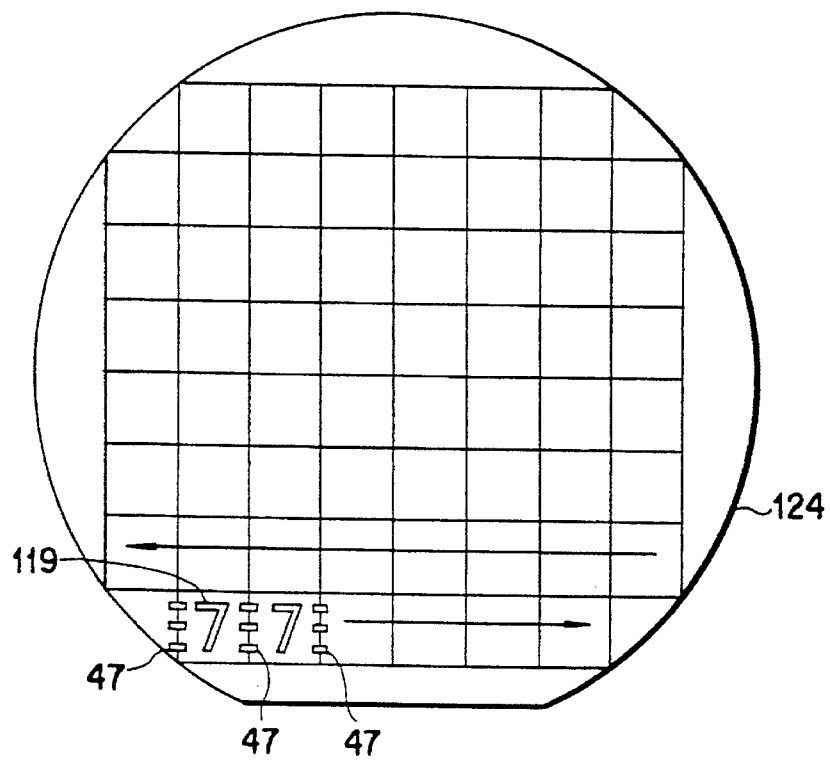

To successively draw a plurality of chips on the wafer 124, the marks are arranged as shown in FIG. 22B. That is, at the time the continuous movement is started, the rectangular beam formed by the rectangular opening 118 of the mask 117 is scanned on the vibration measuring marks 47. The reflected electron detector 146 detects the resulting reflected electrons, measuring relative displacements between the rectangular beam and the marks 47 in the X and Y directions. The measured differences are fed back to the secondary deflecting circuit 145 or to the primary deflecting circuit 144 for controlling the electron beam. This makes it possible to compensate for the relative vibrations between the electron beam and the wafer 124 during drawing. It is also possible to perform the compensation by feeding the measurement results to both the circuit pairs. Note that in FIGS. 22A and 22B, the relative displacement detecting marks 47 are arranged on dicing lines around circuit patterns (chips).

In the drawing apparatus with the above arrangement, relative displacement vibrations between the beam and the marks can be measured during drawing, and the measured differences can be fed back to the secondary deflecting circuits or the primary deflecting circuits for controlling the electron beam. Therefore, a very high drawing accuracy can be accomplished even in an electron beam drawing apparatus of a continuous beam shaping mask stage and wafer stage movement type, which has a high throughput.

In addition, in this fourth embodiment, the position of the electron beam is compensated for by feeding the relative displacement errors back to the secondary or primary deflecting circuits. However, if the relative displacements are slow-moving, low-frequency vibrations such as beam drifts, it is also possible to compensate for the position of the stage by feeding the relative displacement errors back to the driving circuit 135 of the sample stage or to the driving circuit 131 of the mask stage. In this case, since the arrangement of an apparatus is simplified, the above objective can be achieved more inexpensively than when the compensation is performed for the electron beam.

Furthermore, this fourth embodiment has exemplified the electron beam drawing apparatus which performs exposure while continuously moving the mask and the wafer. It is, however, obvious that the present invention is similarly applicable to a variable shaping beam drawing apparatus of a continuous wafer table movement type in which exposure is done.

(Embodiment 5)

FIG. 23 is a block diagram showing the arrangement of an electron beam drawing apparatus according to the fifth embodiment of the present invention. The same reference numerals as in FIG. 19 explained above in the fourth embodiment denote the same parts in FIG. 23, and a detailed description thereof will be omitted. This fifth embodiment is basically identical with the embodiment shown in FIG. 19. In the fifth embodiment, however, a gate circuit 200 and a signal processing circuit 201 are additionally provided.

FIGS. 24A to 24D are timing charts for explaining the operation of the fifth embodiment of the present invention shown in FIG. 23. As shown in FIG. 24A, a CPU 130 controls the drawing cycle and the scan cycle of marks 47. The gate circuit 200, as shown in FIG. 24B, receives a trigger signal from the CPU 130 and transfers the trigger signal to a signal detecting circuit 147 at the same time the beam scans on the mark, thereby setting a reflected electron detector 146 in a signal detection enable state as shown in FIG. 24C. The duration of the signal detection enable state of the reflected electron detector 146 is determined by a signal from the CPU 130. A signal indicating the reflected electron amount that the signal detecting circuit 147 receives from the reflected electron detector 146 is processed by the signal processing circuit 201. Consequently, a relative displacement between the mark and the beam is calculated. The CPU 130 feeds this relative displacement amount back to, e.g., secondary deflecting circuit 145, compensating for the relative displacement.

In the fourth embodiment discussed earlier, since the marks 47 for relative vibration measurement are formed on the dicing lines, the compensation interval of the position compensation is long. Therefore, compensation must be done in a short time interval in performing high-accuracy drawing. In this fifth embodiment, therefore, the gate circuit 200 is used to permit compensation in a short time interval. For this purpose, as shown in FIG. 25A, the marks 47 for measuring relative displacement vibrations between the electron beam and the marks can be arranged inside a circuit pattern. Since arrangement information concerning the circuit pattern is already known, the marks 47 can be arranged, on the basis of this information, at positions on which the circuit pattern is not formed. It is also possible to arrange the marks 47 both inside the circuit pattern and on the dicing lines as shown in FIG. 25B. In this fifth embodiment as described above, the marks can be arranged not only in the peripheral region of a circuit pattern but also inside the circuit where no circuit pattern is present. This makes position compensation in a short time interval possible, so the drawing accuracy can be expected to be greatly improved.

(Embodiment 6)

A displacement error measuring method according to the sixth embodiment of the present invention will be described below. The arrangement of an apparatus used in this sixth embodiment is identical with that shown in FIG. 19. The difference of this embodiment from the first embodiment is the structure of a mark. The structure of the mark used in the sixth embodiment is shown in FIG. 26. A process of manufacturing this mark will be described below. The formation of the mark is performed prior to patterning the first circuit pattern. First, $SiO_2$ is deposited on an Si substrate by using a CVD process. Thereafter, a photoresist is coated and exposed to form a resist pattern by using light or an electron beam. After the $SiO_2$ film is etched by an RIE process by using the resist pattern as a mask, the resist is peeled. Lastly, the Si substrate is etched by using the $SiO_2$ film as a mask, and the $SiO_2$ film is removed, thereby forming the mark shown in FIG. 26. That is, reference numeral 301 denotes the surface of the Si substrate; and 302, trenches formed by the above process. By manufacturing the mark by forming the steps on the surface of the Si substrate, a difference is produced in reflected electron amount between the surfaces 301 and 302. This allows the mark shown in FIG. 26 to have the same function as that of the mark used in the first embodiment. It is of course possible to minimize the depth of the trench as long as a difference is produced between the reflected electron amounts.

In this sixth embodiment, the mark is formed in advance on a portion of a sample, and a circuit pattern is exposed by using this mark. However, it is also possible to form a portion of the pattern into a mark in accordance with the following procedure.

That is, after the first circuit pattern is exposed, a portion of the exposed circuit pattern is formed into a contact pattern which has a shape having a descriptive correlation with the shape of an electron beam shaped by a shaping mask and which consists of, e.g., tungsten, and this contact pattern is used as a mark. Since the position information of this contact pattern is already known, a portion which does not overlap a circuit pattern to be drawn can be used as the mark. The next pattern is exposed while relative displacement errors between a rectangular beam and a sample are measured and compensated for by scanning the mark with the rectangular beam having a shape corresponding to the shape of the mark. It is naturally possible to form a portion of the second and subsequent patterns into the mark as well as the first circuit pattern.

Since tungsten is a heavy metal and therefore has a reflected electron coefficient or a secondary electron emission coefficient different from (larger than) that of a material surrounding the mark, it can be used as an effective mark. It is also possible to use a material other than tungsten as the mark as long as the reflected electron coefficient or the secondary electron emission coefficient of the material is different from that of the surrounding material.

(Embodiment 7)

Figure 27:
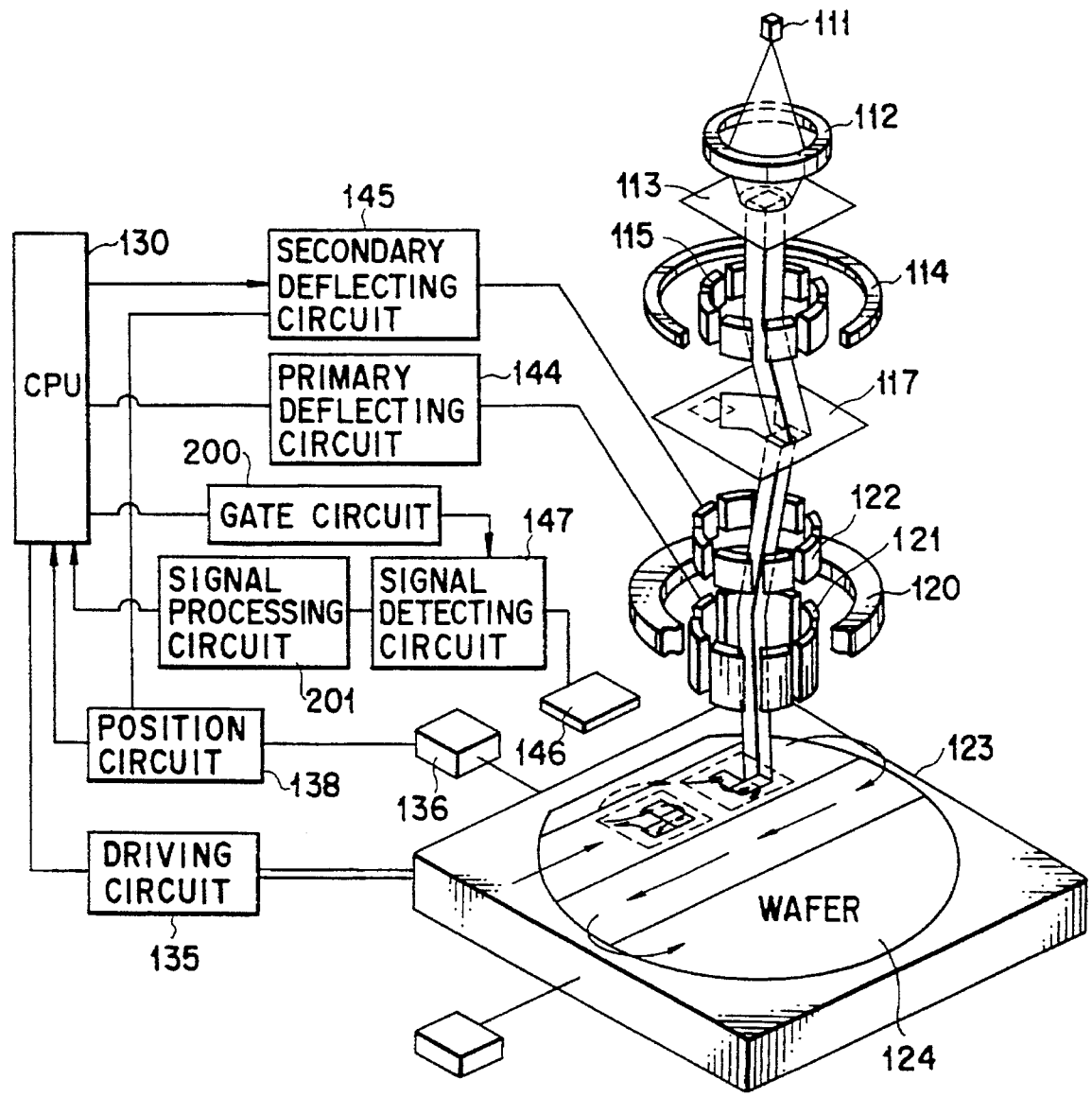
FIG. 27 is a block diagram showing the arrangement of an electron beam drawing apparatus according to the seventh embodiment of the present invention.

FIG. 27 is a block diagram showing the arrangement of an electron beam drawing apparatus according to the seventh embodiment of the present invention. In this seventh embodiment, an electron beam drawing apparatus capable of improving the drawing accuracy by compensating for relative displacements in real time by using the above-mentioned relative displacement detecting method will be described in detail by taking an electron beam drawing apparatus of a continuous wafer movement type as an example. The arrangement of an optical system will be described first. Referring to FIG. 27, reference numeral 111 denotes an electron gun. An electron beam emitted from this electron gun 111 is adjusted to have an appropriate current density by a condenser lens 112 and radiates a beam shaping aperture 113. The image of the aperture 113 is radiated on a mask 117 by a projecting lens 114. The radiation position of this aperture image is moved by a beam shaping deflector 115. The image of the mask 117 on which the image of the aperture 113 is radiated is reduced and projected onto a wafer 124 by a reducing lens (not shown) and an objective lens 120. Note that reference numeral 121 denotes a primary deflector for positioning the image of the mask 117 on the wafer 124; 122, a secondary deflector (high-speed deflector); and 123, a wafer stage movable in a direction perpendicular to the axis of the beam with the wafer 124 mounted on it.

The arrangement of a control system will be described below. The wafer stage 123 is driven by a driving circuit 135 which is operated by commands from a central processing unit (CPU) 130. The wafer stage 123 is moved in the direction perpendicular to the direction of the beam axis. The moving position of the wafer stage 123 is detected by a laser interferometer 136 and a position circuit 138. The obtained detection information is supplied to the CPU 130 and a secondary deflecting circuit 145 (to be described later). The primary deflector 121 is applied with a deflection voltage from a primary deflecting circuit 144, and the secondary deflector 122 is applied with a secondary deflection voltage from the secondary deflecting circuit 145. Consequently, the primary deflector 121 moves the mask image of a small region on the wafer 124, and the secondary deflector 122 compensates for the position of the mask image in accordance with the difference between the theoretical position and the actual position of the wafer stage 123.

The movement of the mask, exposure, and vibration compensation will be described below. The movement of the radiation position of the rectangular beam on the surface of the wafer is illustrated in FIG. 22A as explained earlier. An arrow $C_1$ indicates a state in which mark search is performed by a rectangular beam formed by a mask 117. An arrow $C_2$ indicates drawing, and an arrow $C_3$ indicates step movement. An arrow $C_4$ indicates a state in which the mark search is again performed. Reference numeral 128 denotes a vibration measuring mark. To draw a plurality of chips, the marks are arranged as shown in FIG. 22B. That is, at the time the continuous movement is started, the rectangular beam shaped by the mask 117 is scanned on the vibration measuring marks 128. A reflected electron detector 146 detects the resulting reflected electrons, measuring the relative displacements between the rectangular beam and the marks in the x and Y directions. The measured differences are fed back to the secondary deflecting circuits for controlling the electron beam. This makes it possible to compensate for the relative vibrations between the electron beam and the wafer 124 during drawing. If the relative vibrations are slow-moving, low-frequency vibrations such as beam drifts, the compensation can be performed by using the primary deflecting circuits. It is also possible to perform the compensation by feeding the measurement results to both the circuit pairs.

In the drawing apparatus with the above arrangement, relative displacement vibrations between the beam and the marks can be measured during drawing, and the measured differences can be fed back to the secondary deflecting circuits or the primary deflecting circuits for controlling the electron beam. Therefore, a very high drawing accuracy can be accomplished. Note that the variable shaped beam drawing apparatus is used in this embodiment, but it is of course possible to apply the present invention to a round beam raster-scan, continuous sample movement type electron beam apparatus which performs exposure by using a round beam.

(Modifications)

The present invention is not limited to the above embodiments. For example, the material of the marks used in the embodiments is not limited to the W film but may be any material by which the reflectance of a wafer becomes largely different from that of an electron beam. Generally, the material need only be a heavy metal. In addition, the marks can be formed not only on the surface of a wafer but on the surface of a stage. Furthermore, the present invention can be applied to an ion beam drawing apparatus as well as the electron beam drawing apparatus. Other various modifications of the present invention can be made without departing from the spirit and scope of the invention.

According to the present invention as has been described in detail above, by using the displacement error measuring mark obtained by repeatedly arranging shapes each having a descriptive correlation with the shape of a charged beam, it is readily possible to measure relative vibrations induced between the charged beam and a sample when the charged beam or a stage is continuously moved. By feeding the measurement result back to a beam deflecting system or a stage driving system, drawing can be performed at a high accuracy.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A charged beam drawing apparatus comprising:
   means for drawing a desired pattern on a sample by deflecting a charged beam on said sample while continuously moving a stage on which said sample is placed;
   means for arranging on either said sample or said stage a mark having a line-and-space pattern in which a plurality of lines each having a width equal to a size of said charged beam on said sample are arranged with spaces each equal to the width therebetween;
   means for radiating said charged beam onto said mark while a position of said charged beam is fixed and at the same time continuously moving said stage in a longitudinal direction of said mark, thereby detecting a reflected beam of said charged beam from said mark; and
   means for measuring a relative vibration of said stage with respect to said charged beam during the continuous movement of said stage on the basis of a signal of said reflected beam.

2. An apparatus according to claim 1, wherein said mark consists of a heavy metal.

3. An apparatus according to claim 1, wherein said mark is constituted by a difference between geometrical shapes.

4. An apparatus according to claim 1, wherein said mark consists of a substance having either an electron reflectance or a secondary electron emission coefficient different from that of a substance around said mark.

5. An apparatus according to claim 1, wherein said mark is arranged around a beam scan deflection region on the surface of said sample.

6. An apparatus according to claim 1, wherein said mark is arranged outside a circuit pattern region on the surface of said sample.

7. A charged beam drawing apparatus comprising:
   means for drawing a desired pattern on a sample by deflecting a charged beam on said sample by using a charged beam optical system;
   a plurality of control circuits, arranged in said charged beam optical system, for controlling individual parts of said optical system and supplying power;
   means for selectively supplying to each one of said control circuits power with a frequency different from a frequency of power supplied to other control circuits;
   means for radiating said charged beam onto a mark arranged at a predetermined position on a stage on which said sample is placed, and detecting a reflected beam of said charged beam; and
   means for analyzing a frequency of a signal of said reflected beam and determining whether said control circuit is operating normally in accordance with whether an influence of the different frequency is detected in a peak frequency.

8. An apparatus according to claim 7, wherein said mark is formed by arranging line marks each having a width equal to a side of a shaped beam with equal spaces therebetween such that a plurality of line marks are arranged parallel to a moving direction of said stage and a plurality of line marks are arranged perpendicular to the moving direction of said stage.

9. An apparatus according to claim 7, wherein said mark consists of a heavy metal.

10. An apparatus according to claim 7, wherein said mark is constituted by a difference between geometrical shapes.

11. An apparatus according to claim 7, wherein said mark consists of a substance having either an electron reflectance or a secondary electron emission coefficient different from that of a substance around said mark.

12. An apparatus according to claim 7, wherein said mark is arranged around a beam scan deflection region on the surface of said sample.

13. An apparatus according to claim 7, wherein said mark is arranged outside a circuit pattern region on the surface of said sample.

14. A displacement error measuring method using a charged beam, comprising the steps of:
   shaping a charged beam into a predetermined shape by using a shaping mask;
   arranging repeatedly, as a displacement error measuring mark, shapes each having a descriptive correlation with the predetermined shape of said charged beam, at predetermined portions on either a sample or a stage on which said sample is placed;

moving continuously at least one of said charged beam and said stage while radiating said charged beam onto said mark, and detecting a reflected beam from said mark produced by overlap of said charged beam and said mark; and obtaining a relative displacement error between said charged beam and said mark on the basis of a signal of said reflected beam, wherein said mark is formed by arranging a plurality of line marks each having a width equal to a side of said shaped beam, and the relative displacement error is obtained by using line marks arranged parallel to a moving direction of said stage when a relative displacement in a direction perpendicular to the moving direction of said stage is to be measured, and by using line marks arranged perpendicular to the moving direction of said stage when a relative displacement in the same direction as the moving direction of said stage is to be measured.

15. A charged beam drawing apparatus comprising:

means for arranging repeatedly, as a displacement error measuring mark, shapes each having a descriptive correlation with a shape of a charged beam formed by a shaping mask, at predetermined positions on either a sample or a stage on which said sample is placed;

means for moving continuously at least one of said charged beam and said sample while radiating said charged beam onto said mark, and detecting a reflected beam from said mark produced by overlap of said charged beam and said mark;

means for measuring a relative displacement error between said charged beam and said mark on the basis of a signal of said reflected beam; and means for compensating for a beam position by feeding the relative displacement error back to a deflecting system for said charged beam.

16. An apparatus according to claim 15, wherein said mark is formed by arranging line marks each having a width equal to a side of a shaped beam with equal spaces therebetween such that a plurality of line marks are arranged parallel to a moving direction of said stage and a plurality of line marks are arranged perpendicular to the moving direction of said stage.

17. An apparatus according to claim 15, wherein said mark consists of a heavy metal.

18. An apparatus according to claim 15, wherein said mark is constituted by a difference between geometrical shapes.

19. An apparatus according to claim 15, wherein said mark consists of a substance having either an electron reflectance or a secondary electron emission coefficient different from that of a substance around said mark.

20. An apparatus according to claim 15, wherein said mark is arranged around a beam scan deflection region on the surface of said sample.

21. An apparatus according to claim 15, wherein said mark is arranged outside a circuit pattern region on the surface of said sample.

22. An apparatus according to claim 15, wherein said measuring means measures a relative displacement between said beam and said mark while said shaping mask and said sample are moving in synchronism with each other, and said compensating means compensates for the beam position by feeding an amount of the measured relative displacement back to at least one of a primary deflector and a secondary deflector.

23. An apparatus according to claim 15, wherein said measuring means measures a relative displacement error between a beam shaped by said shaping mask and said sample in motion, and said compensating means compensates for the beam position by feeding an amount of the measured displacement to at least one of a primary deflector and a secondary deflector.

24. An apparatus according to claim 15, wherein said measuring means measures a relative displacement error between a round beam which is shaped by an aperture mask and raster-scanned and said sample which is continuously moving, and said compensating means compensates for the beam position by feeding an amount of the measured displacement to at least one of a primary deflector and a secondary deflector.

25. A semiconductor device with a displacement error measuring mark, comprising:

means for arranging repeatedly as said displacement error measuring mark, shapes each having a descriptive correlation with a shape of a charged beam formed by a shaping mask, at predetermined positions on a surface to be drawn;

means for moving continuously at least one of said charged beam and a sample while radiating said charged beam onto said mark, and detecting a reflected beam from said mark produced by overlap of said charged beam and said mark;

means for measuring a relative displacement error between said charged beam and said mark on the basis of a signal of said reflected beam;

means for compensating for a beam position by feeding the measured relative displacement error back to a deflecting system for said charged beam; and means for drawing a desired circuit pattern by using said compensated charged beam;

wherein said mark is formed by arranging a plurality of line marks each having a width equal to a side of a shaped beam with equal spaces therebetween such that a plurality of line marks are arranged parallel to a moving direction of said stage and a plurality of line marks are arranged perpendicular to the moving direction of said stage.

26. An apparatus according to claim 15, wherein said mark consists of a heavy metal.

27. An apparatus according to claim 25, wherein said mark is constituted by a difference between geometrical shapes.

28. An apparatus according to claim 25, wherein said mark consists of a substance having either an electron reflectance or a secondary electron emission coefficient different from that of a substance around said mark.

29. An apparatus according to claim 25, wherein said mark is arranged around a beam scan deflection region on the surface of said sample.

30. An apparatus according to claim 25, wherein said mark is arranged outside a circuit pattern region on the surface of said sample.

31. An apparatus according to claim 25, wherein said measuring means measures a relative displacement between said beam and said mark while said shaping mask and said sample are moving in synchronism with each other, and said compensating means compensates for the beam position by feeding an amount of the measured relative displacement back to at least one of a primary deflector and a secondary deflector.

32. An apparatus according to claim 25, wherein said measuring means measures a relative displacement error between a beam shaped by said shaping mask and said sample in motion, and said compensating means compensates for the beam position by feeding an amount of the measured displacement to at least one of a primary deflector and a secondary deflector.

33. An apparatus according to claim 25, wherein said measuring means measures a relative displacement error between a round beam which is shaped by an aperture mask and raster-scanned and said sample which is continuously moving, and said compensating means compensates for the beam position by feeding an amount of the measured displacement to at least one of a primary deflector and a secondary deflector.

* * * * *